(12) United States Patent
Liu et al.

(10) Patent No.: US 12,148,753 B2
(45) Date of Patent: Nov. 19, 2024

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Li-Wei Liu, Taichung (TW); Chi-Ruei Yeh, New Taipei (TW); Tsung-Yu Chiang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 357 days.

(21) Appl. No.: 17/585,830

(22) Filed: Jan. 27, 2022

(65) Prior Publication Data

US 2023/0238381 A1 Jul. 27, 2023

(51) Int. Cl.
*H01L 27/092* (2006.01)
*H01L 21/8238* (2006.01)
*H01L 29/66* (2006.01)

(52) U.S. Cl.
CPC .. *H01L 27/0924* (2013.01); *H01L 21/823821* (2013.01); *H01L 29/66545* (2013.01)

(58) Field of Classification Search
CPC ......... H01L 27/0924; H01L 21/823821; H01L 29/66545; H01L 21/76831; H01L 21/76897; H01L 21/28518; H01L 21/76843; H01L 21/76855; H01L 29/7848
See application file for complete search history.

(56) References Cited

U.S. PATENT DOCUMENTS

| 2020/0075725 A1* | 3/2020 | Wu ...................... H01L 29/785 |
| 2020/0105606 A1* | 4/2020 | Lin ................... H01L 21/02576 |

* cited by examiner

*Primary Examiner* — Karen Kusumakar
*Assistant Examiner* — Adam S Bowen
(74) *Attorney, Agent, or Firm* — WPAT LAW; Anthony King

(57) ABSTRACT

A method includes forming an n-type Fin-Field Effect Transistor (FinFET) and a p-type FinFET. The forming of the n-type FinFFT includes: forming a first auxiliary gate stack over a first semiconductor fin; forming an n-type source/drain region on the first semiconductor fin adjacent to the first auxiliary gate stack; and performing a first etch to form a first recess with a first depth on a first top surface of the n-type source/drain region. The forming of the p-type FinFFT includes: forming a second auxiliary gate stack over a second semiconductor fin; forming a p-type source/drain region on the second semiconductor fin adjacent to the second auxiliary gate stack; and performing a second etch to form a second recess with a second depth on a second top surface of the p-type source/drain region. The first depth is greater than the second depth.

20 Claims, 37 Drawing Sheets

SEMICONDUCTOR STRUCTURE AND METHOD OF FORMING THE SAME

BACKGROUND

A modern transistor generally includes a gate electrode and source/drain regions. The transistor also includes source/drain contact plugs to electrically connect to the source/drain regions. The transistor may also include dielectric materials to electrically insulate the source/drain contact plugs from the gate electrode. As the device size continues to shrink, the manufacturing processes may become more complicated in order to improve production yield and device performance. For example, the performance of the transistor is determined at least by the resistance of the features in the transistor, e.g., source/drain contact plugs. Therefore, there is a need to enhance the manufacturing processes to reduce the resistance while keeping the compact size of the advanced transistors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
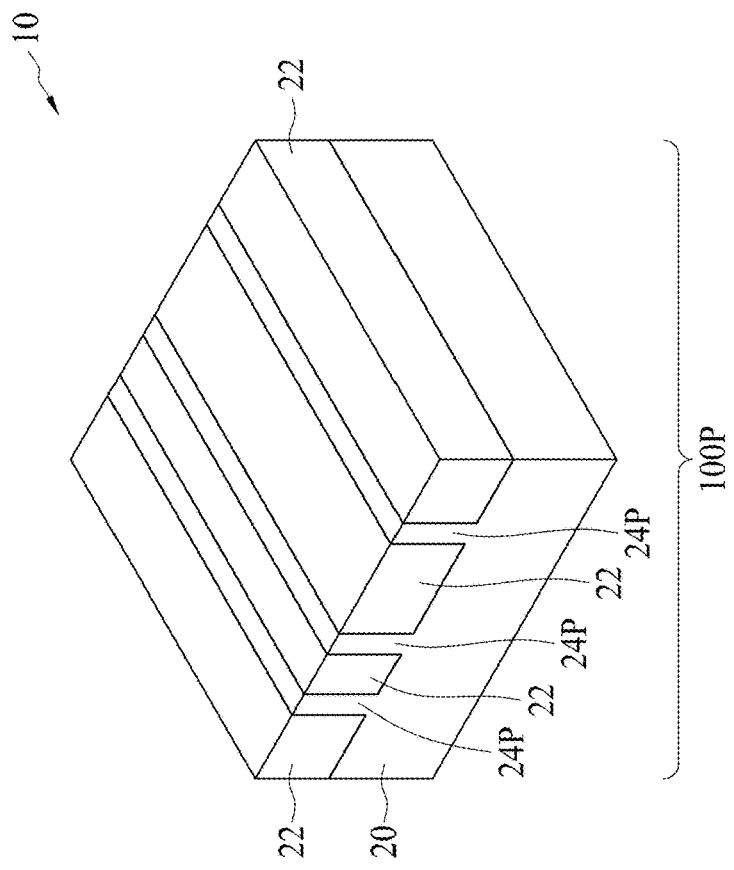
FIGS. 1, 2, 3A, 3B, 3C, 4A, 4B, 4C, 5A, 5B, 6A, 6B, 7A, 7B, 7C, 8A, 8B, 8C, 9, 10A, 10B, 11A, 11B, 12A, 12B, 13A, 13B and 13C illustrate the perspective views and cross-sectional views of intermediate stages in the formation of an n-type Fin Field-Effect Transistor (FinFET) and a p-type FinFET in accordance with some embodiments.
Figure 1:
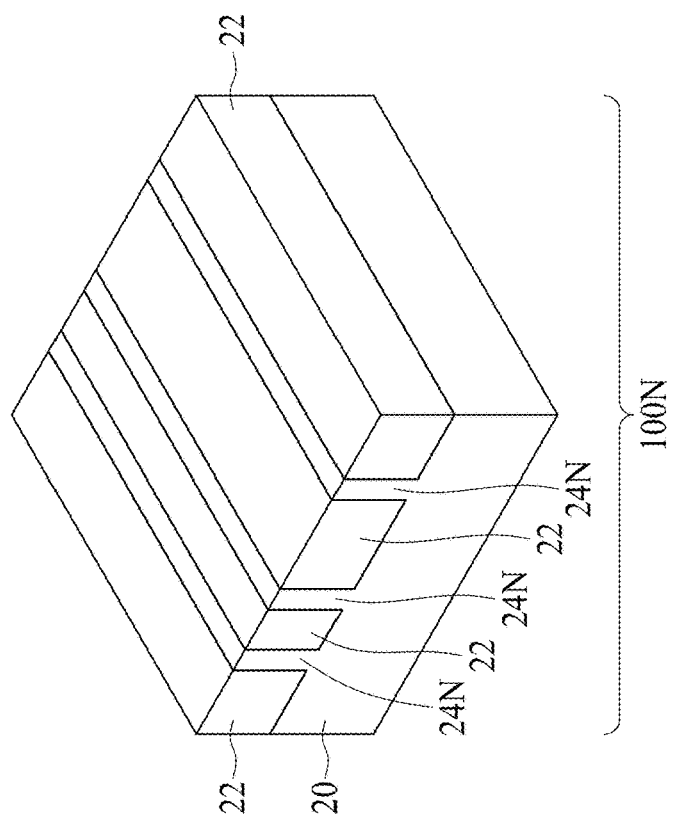

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may present between the coupled devices and elements. In some other cases, a coupling between at least two devices or elements may involve physical contact and/or electrical connections.

The present disclosure discusses an n-type Fin Field-Effect Transistor (FinFET), a p-type FinFET, and the method of forming the same. In some cases, the present disclosure proposes structures and methods of forming for the contact plugs of the n-type source/drain regions and the p-type source/drain regions. Generally, the n-type source/drain region of the n-type FinFET and the p-type source/drain region of the p-type FinFFT are recessed to form the respective n-type and p-type source/drain contact recesses, wherein the contact plugs of the n-type FinFFT and the p-type FinFFT are formed within the respective n-type and p-type source/drain contact recesses. In accordance with some embodiments of the present disclosure, the n-type source/drain contact recess is formed having a depth greater than the p-type source/drain contact recess. This depth variation arrangement of the contact recesses may be performed among the n-type FinFFT and the p-type FinFFT in order to seek better balance between the channel resistance and the contact resistance of the p-type FinFET, while maintaining low contact resistance of the n-type FinFET. Various embodiments discussed herein are to provide examples to enable making or using the subject matter of the present disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2, 3A, 3B, 3C, 4A, 4B, 4C, 5A, 5B, 6A, 6B, 7A, 7B, 7C, 8A, 8B, 8C, 9, 10A, 10B, 11A, 11B, 12A, 12B, 13A, 13B and 13C illustrate the perspective views and cross-sectional views of intermediate stages in the formation of an n-type Fin Field-Effect Transistor (FinFET) and a p-type FinFET in accordance with some embodiments.

FIG. 1 illustrates a perspective view of a semiconductor structure 10, which may be a wafer. The semiconductor structure 10 includes a substrate 20. The substrate 20 may be a semiconductor substrate, which is formed of silicon, germanium substrate, silicon germanium, silicon carbide, gallium arsenide, or a substrate formed of other semiconductor materials. In some embodiments, the substrate 20 is doped with a p-type an n-type impurity. Alternatively, the substrate 20 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 20 is a semiconductor-on-insulator (SOI) substrate. In other alternatives, the substrate 20 may include a doped epitaxial layer, a gradient semiconductor layer, or a semiconductor layer overlaying another semiconductor layer of a different type, such as a silicon layer on a silicon germanium layer.

In accordance with some embodiments, the substrate 20 is etched for forming semiconductor strips 24 (including semiconductor strips 24N and 24P) protruding from the lower portion of the substrate 20. The semiconductor strips 24 may be formed by any suitable method. For example, the semiconductor strips 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor strips 24.

As shown in FIG. 1, isolation regions 22, such as Shallow Trench Isolation (STI) regions, are formed to extend from a top surface of the substrate 20 into a depth of the substrate 20. The top surfaces of the semiconductor strips 24 and the top surfaces of the isolation regions 22 may be substantially level with each other in accordance with some embodiments. As an example forming process of the isolation regions 22, the substrate 20 is etched to form the semiconductor strips 24 and trenches between the semiconductor strips 24. A liner oxide (not shown) may be formed lining sidewalls and bottoms of the trenches, in which the liner oxide may be a thermal oxide formed through thermal oxidation of a surface layer of the substrate 20. The liner oxide may also be alternatively formed of deposited silicon oxide using, e.g., Atomic Layer Deposition (ALD), High-Density Plasma Chemical Vapor Deposition (HDPCVD), or Chemical Vapor Deposition (CVD). A dielectric material, e.g., oxide, is then deposited over the liner oxide and fills the trenches, wherein the dielectric material may be formed using Flowable Chemical Vapor Deposition (FCVD), spin coating, or the like.

The wafer 100 includes at least one n-type device region 100N for forming an n-type FinFET, and at least one p-type device region 100P for forming a p-type FinFET. Throughout the disclosure, for ease of recognition of similar features with different configurations in the n-type device region 100N and the o-type device region 100P, the features formed in the n-type device region 100N may be referred to with a reference number followed by letter "N," and the features formed in the p-type device region 100P may be referred to with a reference number followed by letter "P." For example, the semiconductor strips 24 in the n-type device region 100N may be labeled as 24N, and the semiconductor strips 24 in the p-type device region 100P may be labeled as 24P. In accordance with some embodiments, semiconductor strips 24N include silicon (without germanium), while semiconductor strips 24P are formed of silicon germanium.

Figure 2:
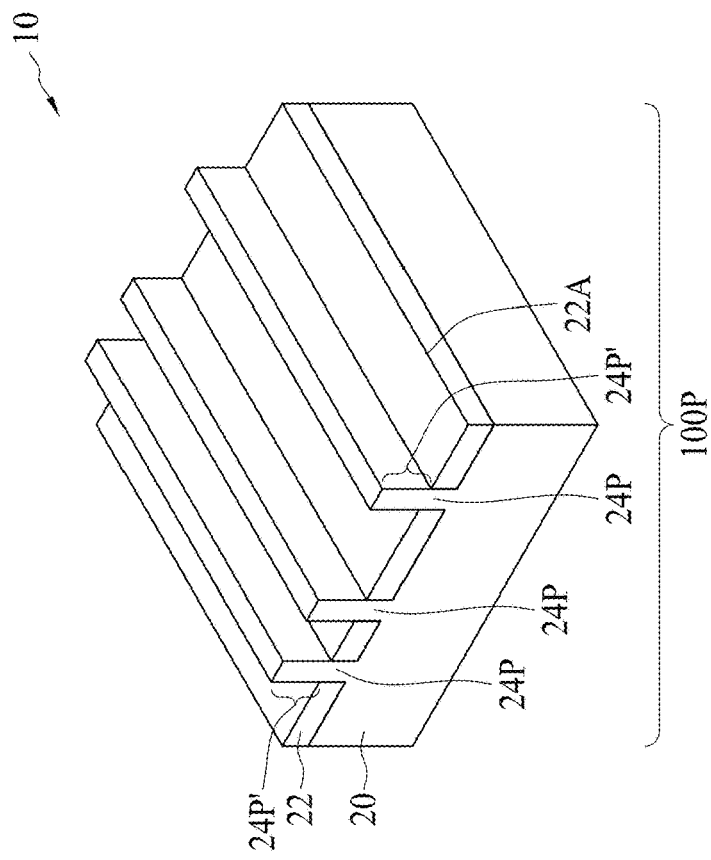
Figure 2:
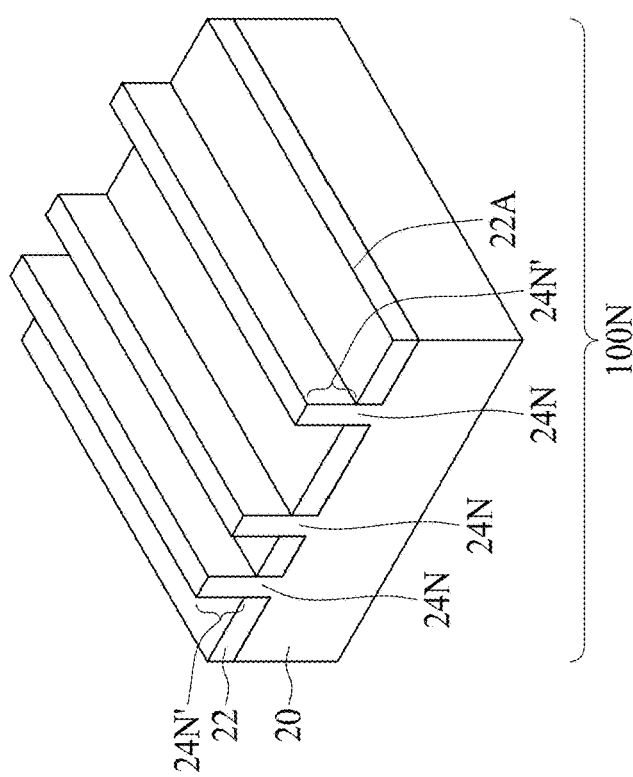

Referring to FIG. 2, the isolation regions 22 are recessed, so that the top portions of semiconductor strips 24N and 24P protrude from top surfaces 22A of isolation regions 22 to form protruding fins 24' including protruding fins 24N' and 24P'. The portions of semiconductor strips 24N and 24P buried in the isolation regions 22 are still referred to as semiconductor strips 24N and 24P, respectively. The etching may be performed using a dry etching process, wherein a mixture of HF and NH$_3$ may be used as the etching gas. Plasma may be used to assist with the etching performance. Argon may also be included. In accordance with alternative embodiments of the present disclosure, the recessing of isolation regions 22 is performed using a wet etching process. The wet etching may include an HF-based solution.

Figure 3A:
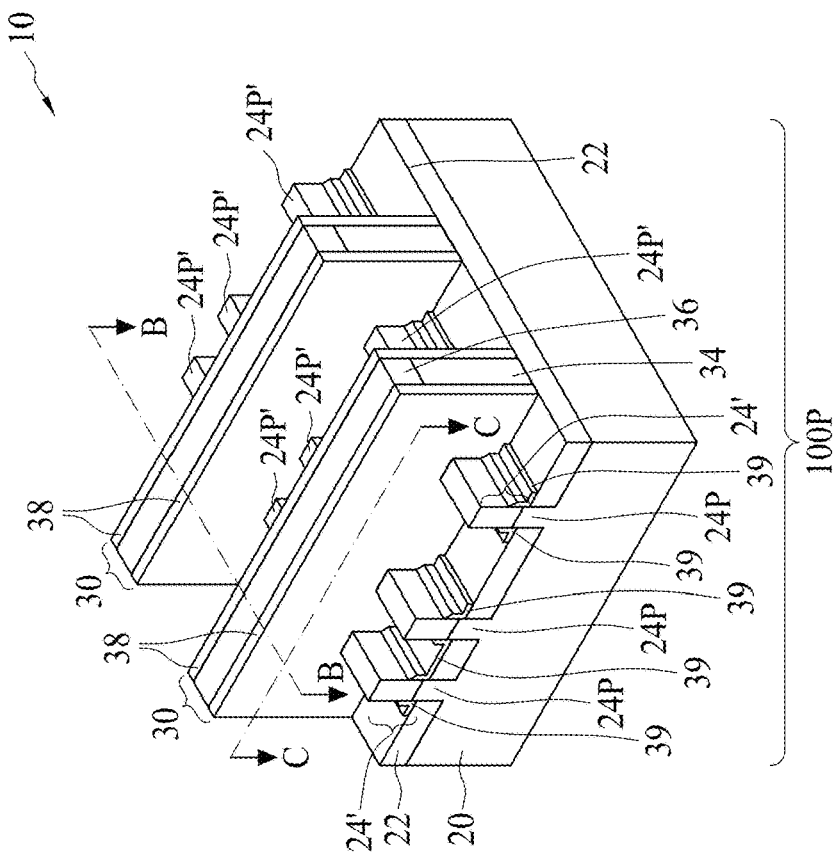
Figure 3A:
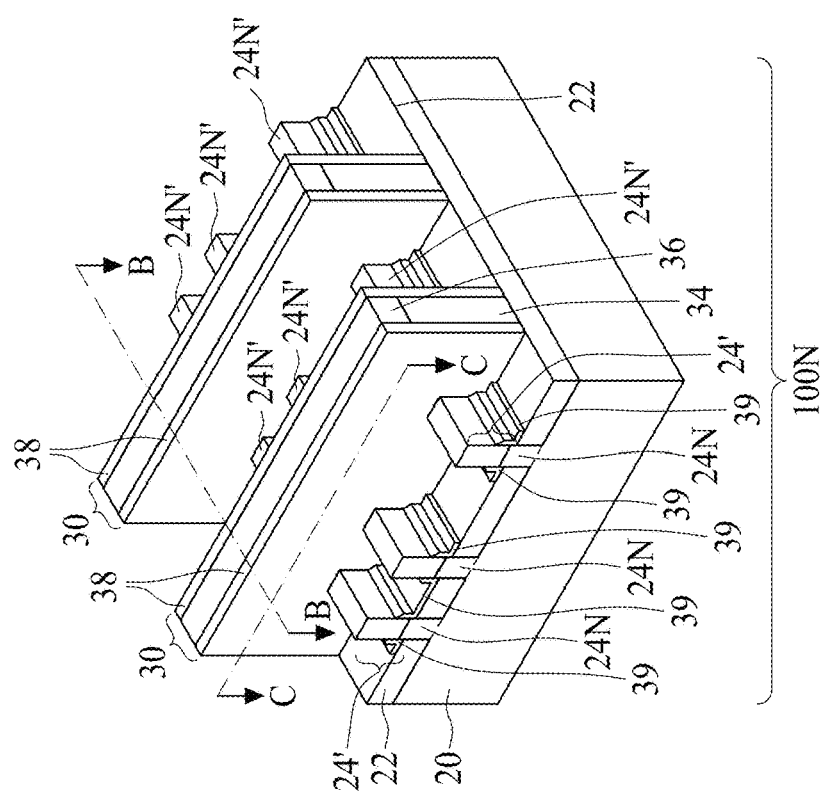
Figure 3B:
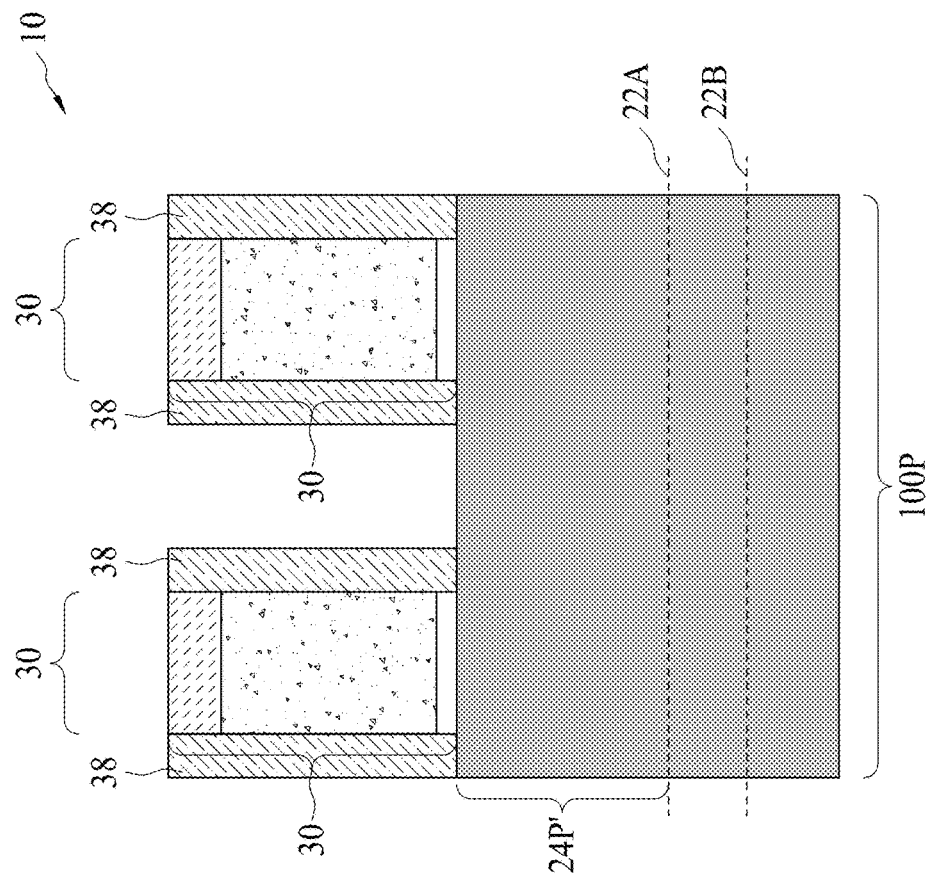
Figure 3B:
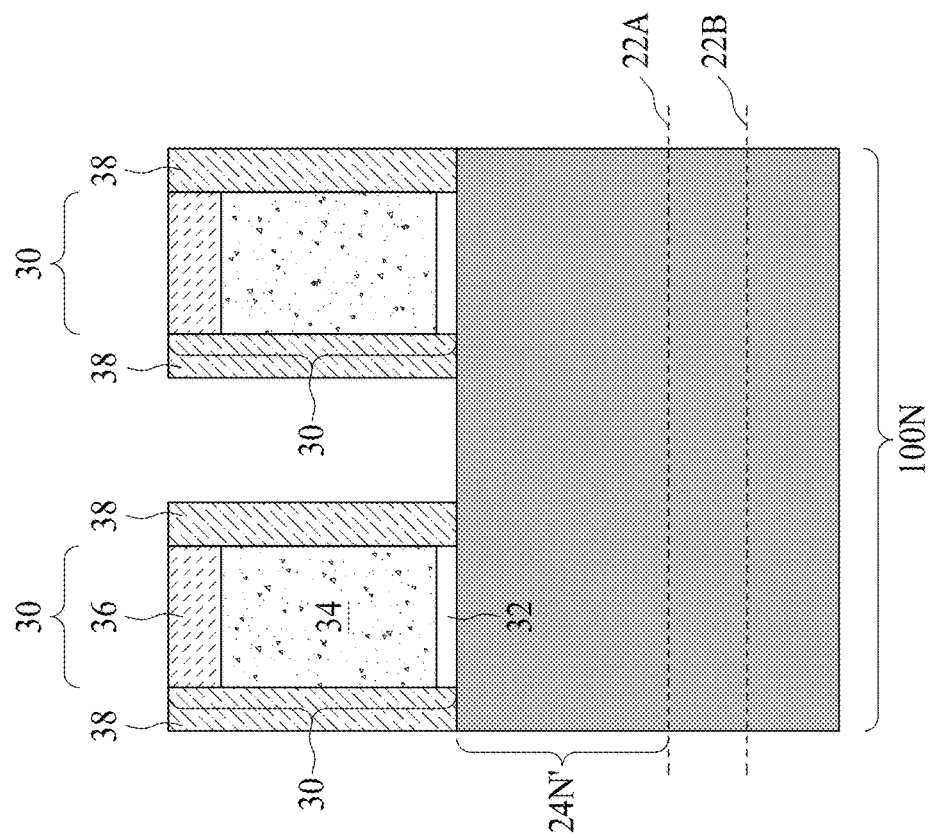
Figure 3C:
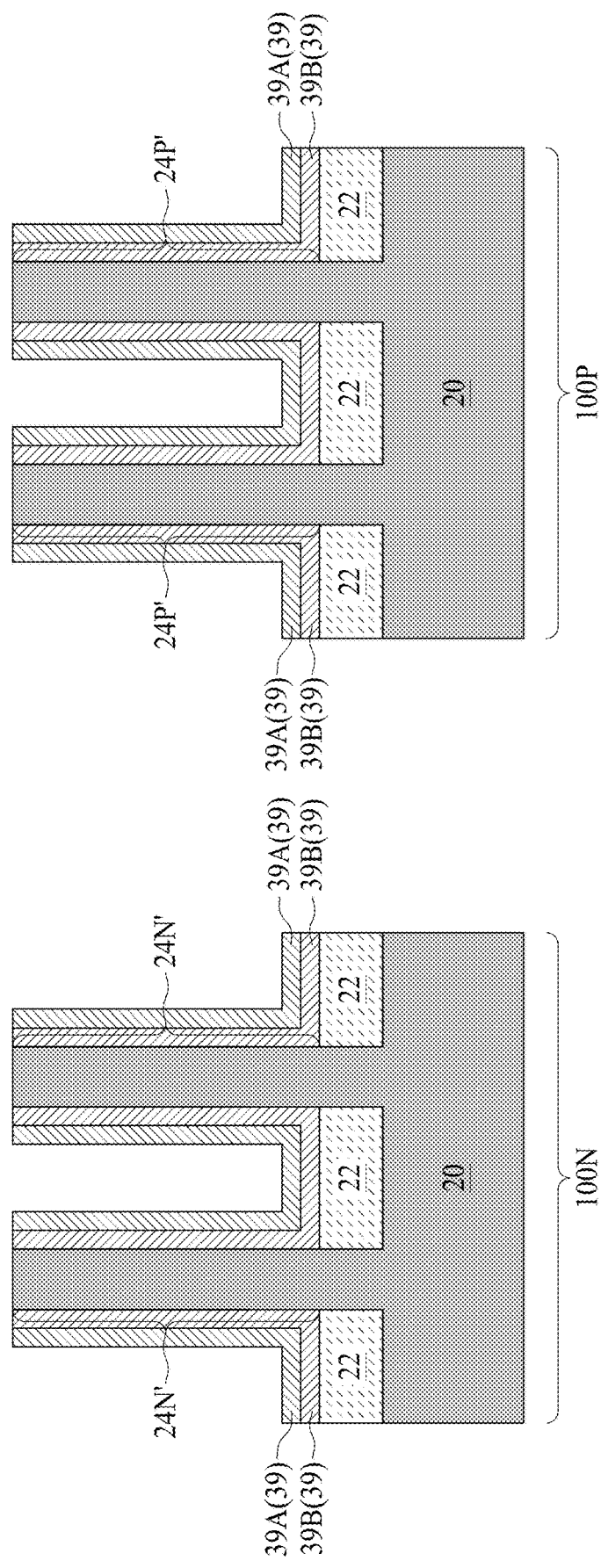

Referring to FIGS. 3A, 3B, and 3C, auxiliary (dummy) gate stacks 30 are formed over the protruding fins 24N' and 24P'. The cross-sectional view shown in FIG. 3B is drawn from the cross-section line B-B in FIG. 3A, and the cross-sectional view shown in FIG. 3C is drawn from the cross-section line C-C in FIG. 3A. In accordance with some embodiments, a fin-group for forming a FinFET may include one fin or a plurality of fins tightly grouped together. For example, the example shown in FIG. 3A illustrates a 2-fin group on the left, and a single fin (or a multi-fin fin-group) on the right. The fins in the same fin group may have spacings (referred to as inner-group spacing) smaller than the inter-group spacings between neighboring fin-groups.

Referring to FIG. 3B, each of the auxiliary gate stacks 30 includes an auxiliary gate dielectric layer 32 and an auxiliary gate electrode 34 over the respective auxiliary gate dielectric layer 32. In some embodiments, the auxiliary gate electrodes 34 are formed using, for example, amorphous silicon or polysilicon, and other materials may also be used. Each of the auxiliary gate stacks 30 may also include a mask layer 36, in the form of a single-layer or multilayer structure, over the auxiliary gate electrode 34. The mask layer 36 may be formed of silicon nitride, silicon carbo-nitride, or the like. The auxiliary gate stack 30 extends in a lengthwise direction perpendicular to the lengthwise direction in which the protruding fins 24' (24N' or 24P') extend.

Gate spacers 38 are formed on the sidewalls of auxiliary gate stacks 30, as shown in FIGS. 3A and 3B. In accordance with some embodiments of the present disclosure, the gate spacers 38 are formed of dielectric materials such as silicon carbon-oxynitride (SiCN), silicon nitride, silicon oxy-carbon-oxynitride (SiOCN), or the like, and may have a single-layer structure or a multi-layer structure including a plurality of dielectric layers.

FIG. 2 illustrates the levels of the top surface 22A and the bottom surface 22B of the isolation region 22, wherein the protruding fin 24' is higher than top surface 22A. However, the isolation regions 22 located between the surfaces 22A and 22B are not illustrated in FIG. 3B since they can be shown only in other planes. Therefore, only levels of the top surface 22A and the bottom surface 22B of the isolation region 22 are also marked FIG. 3B with dashed lines for reference.

As shown in FIG. 3C, fin spacers 39 are formed on the sidewalls of the protruding fins 24'. In accordance with some embodiments of the present disclosure, the fin spacers 39 are formed by the same processes for forming the gate spacers 38. For example, in the process for forming the gate spacers 38, dielectric layer(s) are deposited in a blanket manner and etched. Some portions left on the sidewalls of protruding fins 24'N and 24P' after the etching form the fin spacers 39. In accordance with some embodiments, the fin spacers 39 include first fin spacers 39A and second fin spacers 39B between the corresponding first spacers 39A and the protruding fins 24'. In some embodiments, the first fin spacer 39A is formed of a different material from the second fin spacer 39B, e.g., one of the first fin spacer 39A and the second fin spacer 39B is formed of nitride, and the other is formed of oxide.

FIGS. 4A, 4B, 4C, 5A, 5B, 6A, 6B, 7A, 7B and 7C illustrate the processes for forming an n-type source/drain regions 42N in the n-type device region 100N and a p-type source/drain regions 42P in the p-type device region 100P. For convenience of comparison of the n-type source/drain region 42N and the p-type source/drain region 42P, the corresponding operations for forming each of the layers in the n-type source/drain region 42N and the p-type source/drain region 42P are illustrated in the same figures. This however, does not mean the corresponding layers in the n-type source/drain region 42N and the p-type source/drain region 42P are formed using the common operations or at the same time. In some embodiments, the n-type source/drain region 42N and the p-type source/drain region 42P are formed in separate operations. In accordance with some embodiments, the n-type source/drain region 42N are formed first, followed by the formation of the p-type source/drain region 42P, which means the processing steps shown for forming the n-type device region 100N in FIGS. 4A, 4B, 4C, 5A, 5B, 6A, 6B, 7A, 7B and 7C are performed first, followed by the processing steps shown for forming the p-type device region 100P in FIGS. 4A, 4B, 4C, 5A, 5B, 6A, 6B, 7A, 7B and 7C. In accordance with alternative embodiments, the p-type source/drain region 42P is formed first, followed by the formation of the n-type source/drain region 42N. In accordance with other embodiments, the processing steps for forming the n-type source/drain region 42N are alternately arranged with those for forming the p-type source/drain region 42P. Some perspective views of some processing steps may be omitted for the sake of brevity.

Figure 4A:
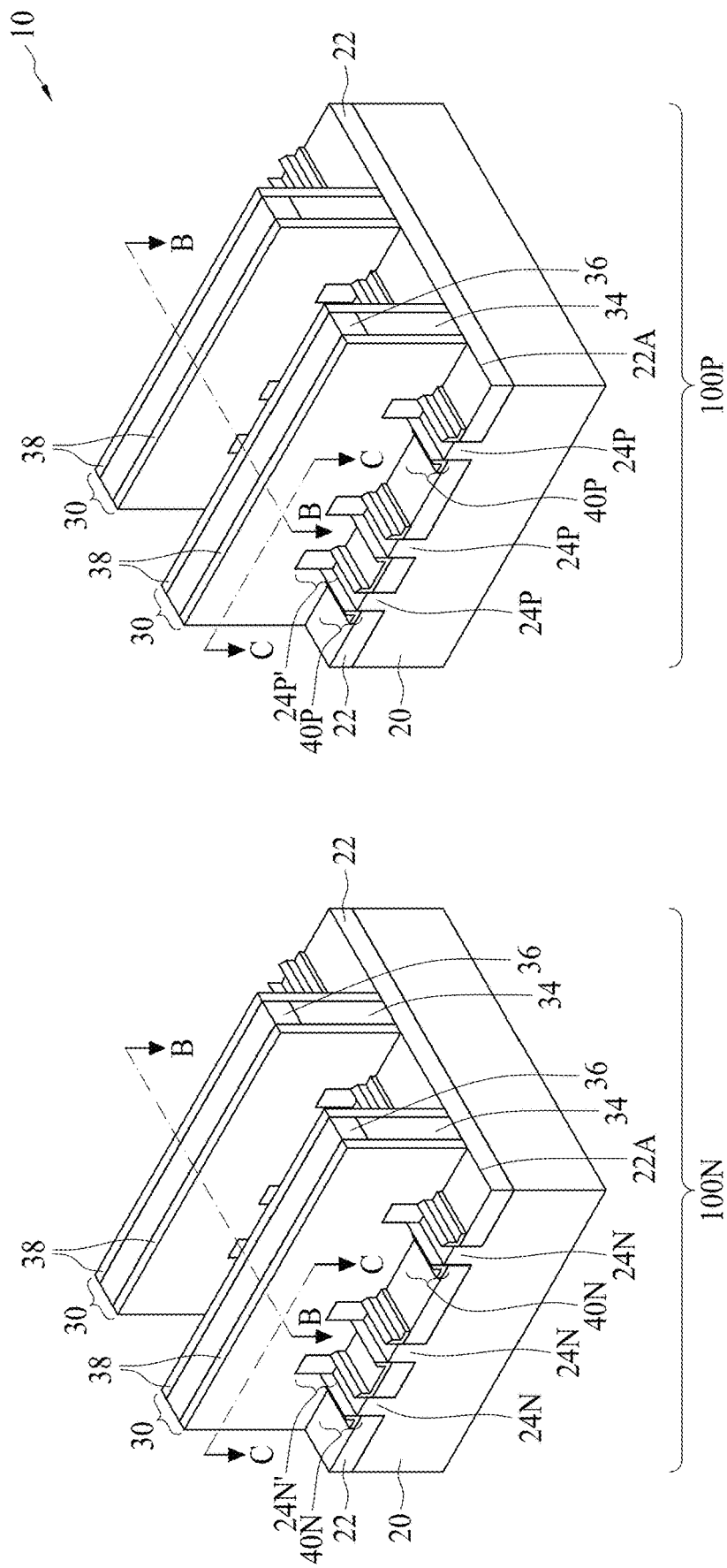
Figure 4B:
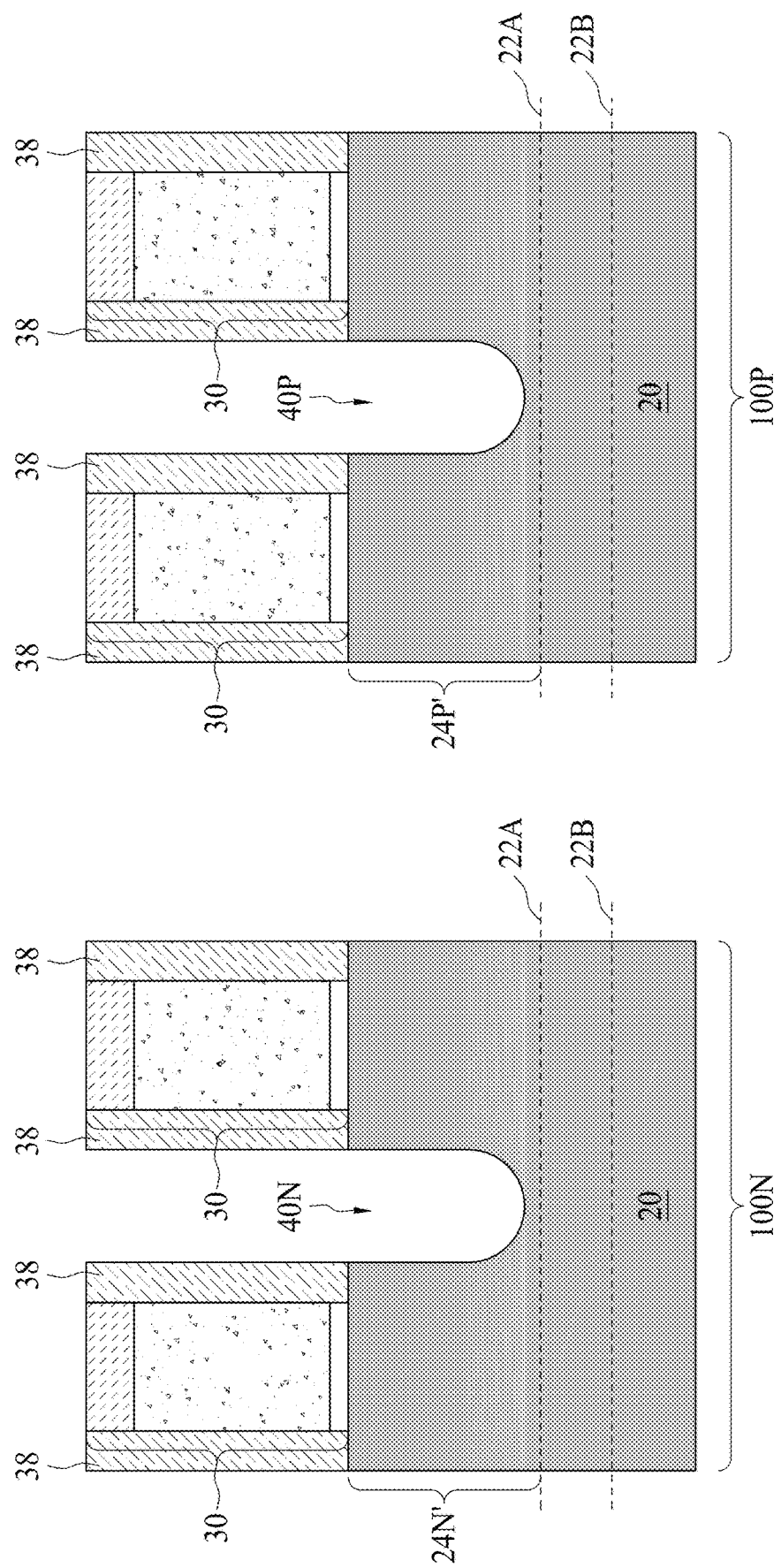
Figure 4C:
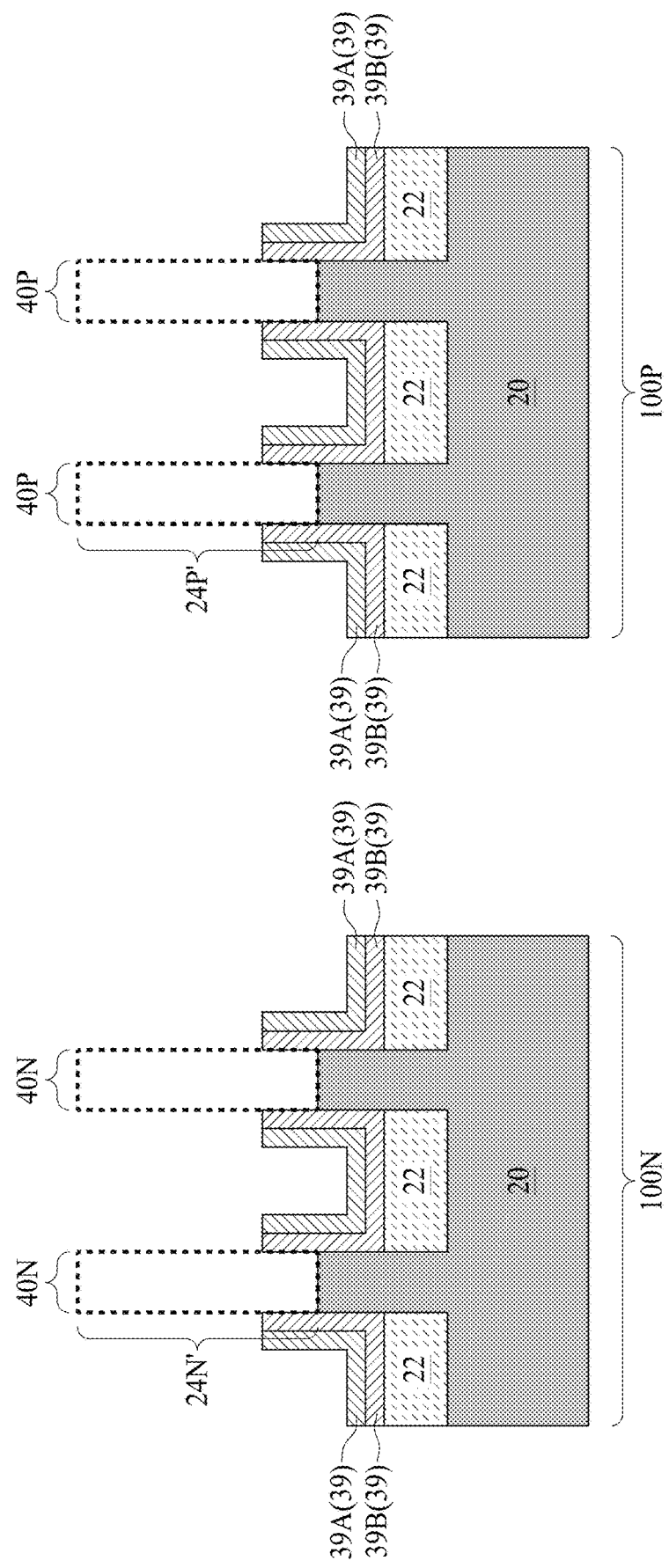

Referring to FIGS. 4A, 4B, and 4C, etching operations (also referred to as a source/drain recessing operation) are performed to recess the portions of the protruding fins 24N' and 24P' that are not covered by the auxiliary gate stacks 30 and the gate spacers 38. FIGS. 4B and 4C illustrate the cross-sectional views obtained from cross-section lines B-B and C-C, respectively, in FIG. 4A. FIGS. 4A and 4B illustrate recesses 40N and 40P are formed in the n-type FinFET region 100N and the p-type FinFET region 100P, respectively. The dashed boxes shown over the protruding fins 24N' and 24P' of FIG. 4C illustrate the portions of protruding fins 24N' and 24P' directly below the gate spacers 38 and auxiliary gate stacks 30, in which these portions are not etched and thus are illustrated as dashed boxes since they are not in the illustrated plane. Also, the dashed boxes also illustrate the recesses 40N and 40P drawn from the section lines C-C.

The recessing operation may be anisotropic. As a result, the portions of fins 24N' and 24P' directly underlying auxiliary gate stacks 30 and gate spacers 38 are not etched. The recesses 40N and 40P are also located on opposite sides of the auxiliary gate stacks 30, as shown in FIG. 4A. Although shown in the same figure, the recess 40N may be formed in a separate operation from the formation of the recess 40P.

In accordance with some embodiments of the present disclosure, the recessing operation is performed through a dry etch operation. The dry etch may be performed using process gases such as $C_2F_6$, $CF_4$, $SO_2$, the mixture of HBr, $Cl_2$, and $O_2$, the mixture of HBr, $Cl_2$, $O_2$, and $CF_2$, or the like. In accordance with some embodiments of the present disclosure, as shown in FIG. 4B, the sidewalls of protruding fins 24N' and 24P' facing the corresponding recesses 40N and 40P are substantially vertical, and are substantially flush with the outer sidewalk of the corresponding gate spacers 38. In accordance with some embodiments, the bottoms of the recesses 40N and 40P are higher than the top surfaces 22A of the isolation regions 22. In accordance with alternative embodiments, the bottoms of recesses 40N and 40P may be level with or lower than the top surfaces 22A of the isolation regions 22.

In accordance with some embodiments, during the etching of protruding fins 24', fin spacers 39 are also etched, so that the heights of the first spacer 39A and second spacer 39B are reduced. The etched protruding fins 24N' and 24P' may have less heights than the etched fin spacers 39.

Figure 5A:
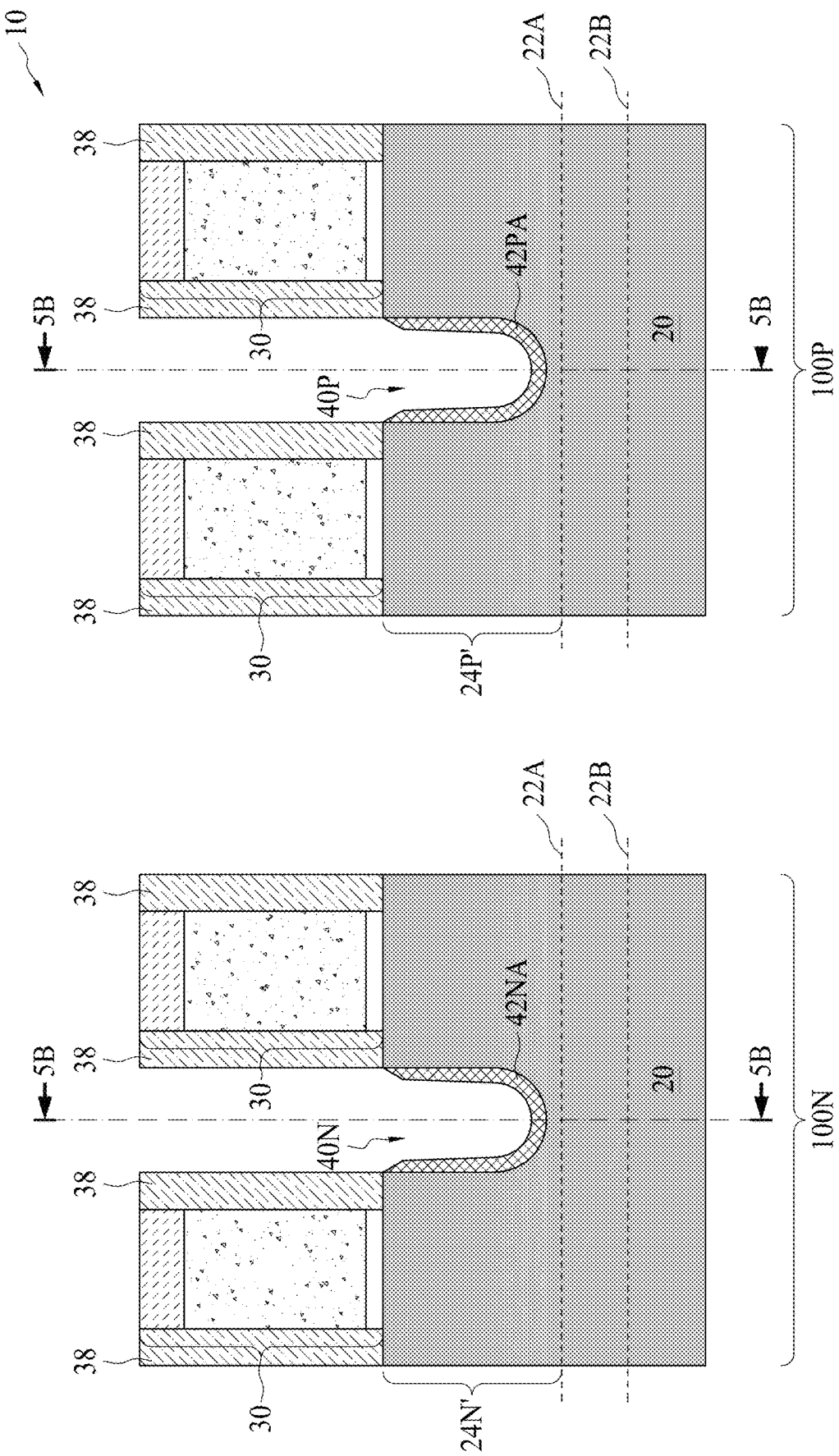
Figure 5B:
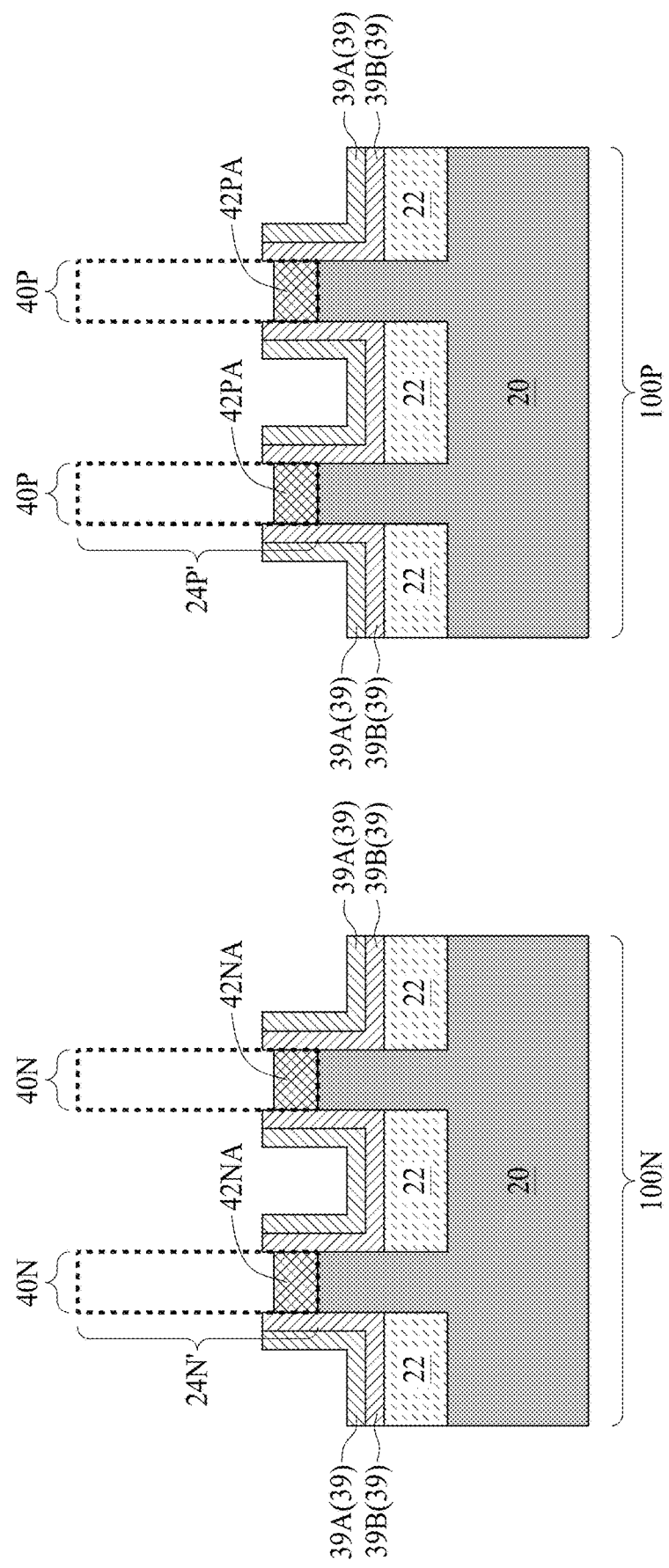

Referring to FIGS. 5A and 5B, first epitaxy layers are deposited in the n-type FinFET region 100N through an epitaxy operation. In accordance with some embodiments, the deposition of the first epitaxy layer 42NA is performed in a non-conformal manner, so that the bottom portion of first epitaxy layer 42NA is thicker than the sidewall portions. This may be achieved by growing the epitaxy layer 42NA on the (100) surface of the substrate 20 faster than on the (110) surface of the substrate 20.

The deposition of the first epitaxy layer 42NA may be performed using Reduced Pressure Chemical Vapor Deposition (RPCVD), Plasma Enhanced Chemical Vapor Deposition (PECVD), or the like. N-type dopants, such as phosphorous, arsenic, antimony, the like, or combinations thereof, may be doped during the epitaxy operation or implanted in a separate implantation operation.

In accordance with some embodiments, the first epitaxy layer 42NA includes SiP. In accordance with alternative embodiments, the first epitaxy layer 42NA includes SiAs. In accordance with yet alternative embodiments, the first epitaxy layer 42NA includes a SiAs layer and a SiP layer over the SiAs layer. The process gas for depositing the first epitaxy layer 42NA may include a silicon-containing gas such as silane, dicholorosilane (DCS), or the like, and a dopant-containing process gas such as $PH_3$, $AsH_3$, or the like, depending on the desirable composition of the first epitaxy layer 42NA.

Further referring to FIGS. 5A and 5B, first epitaxy layers 42PA are deposited in the p-type FinFET region 100P through an epitaxy operation. In accordance with some embodiments, the epitaxy is performed in a non-conformal manner, so that the bottom portion of first epitaxy layer 42PA is thicker than the sidewall portions. The deposition may be performed using RPCVD, PECVD, or the like. In accordance with some embodiments, the first epitaxy layer 42PA is formed of or comprises SiGeB. The process gas for depositing the first epitaxy layer 42PA may include a silicon-containing gas such as silane, disilane ($Si_2H_6$) dicholorosilane (DCS), or the like, a germanium containing gas such as germane ($GeH_4$), digermane ($Ge_2H_6$), or the like, and a dopant-containing process gas such as $B_2H_6$ or the like, depending on the desirable composition of the first epitaxy layer 42PA. P-type dopants, such as boron, indium, or the like, may be doped during the epitaxy operation or a separate implantation operation.

The first epitaxy layer 42NA may have a first (phosphorus) doping concentration in the range between about $1\times10^{20}$ atoms/cm$^3$ and about $1\times10^{21}$ atoms/cm$^3$. The first epitaxy layer 42PA may have a (boron) doping concentration in the range between about $1\times10^{20}$ atoms/cm$^3$ and about $1\times10^{21}$ atoms/cm$^3$. The germanium atomic percentage of the first epitaxy layer 42PA may be in the range between about 10 percent and about 30 percent. In the deposition operation, an etching gas such as HCl is used to aid in selective deposition on the semiconductor surface, but not on the dielectric surface. The carrier gas, such as $H_2$ and $N_2$, may also be included in the process gas, for example, with a flow rate in the range between about 50 sccm and about 500 sccm.

In accordance with some embodiments, the first epitaxy layer 42NA and the first epitaxy layer 42PA may be grown to different volumes or heights, according to different design requirements. In accordance with some embodiments, one or both of the first epitaxy layer 42NA and the first epitaxy layer 42PA is grown higher than the upper end of the fin spacers 39 and forms facets.

Figure 6A:
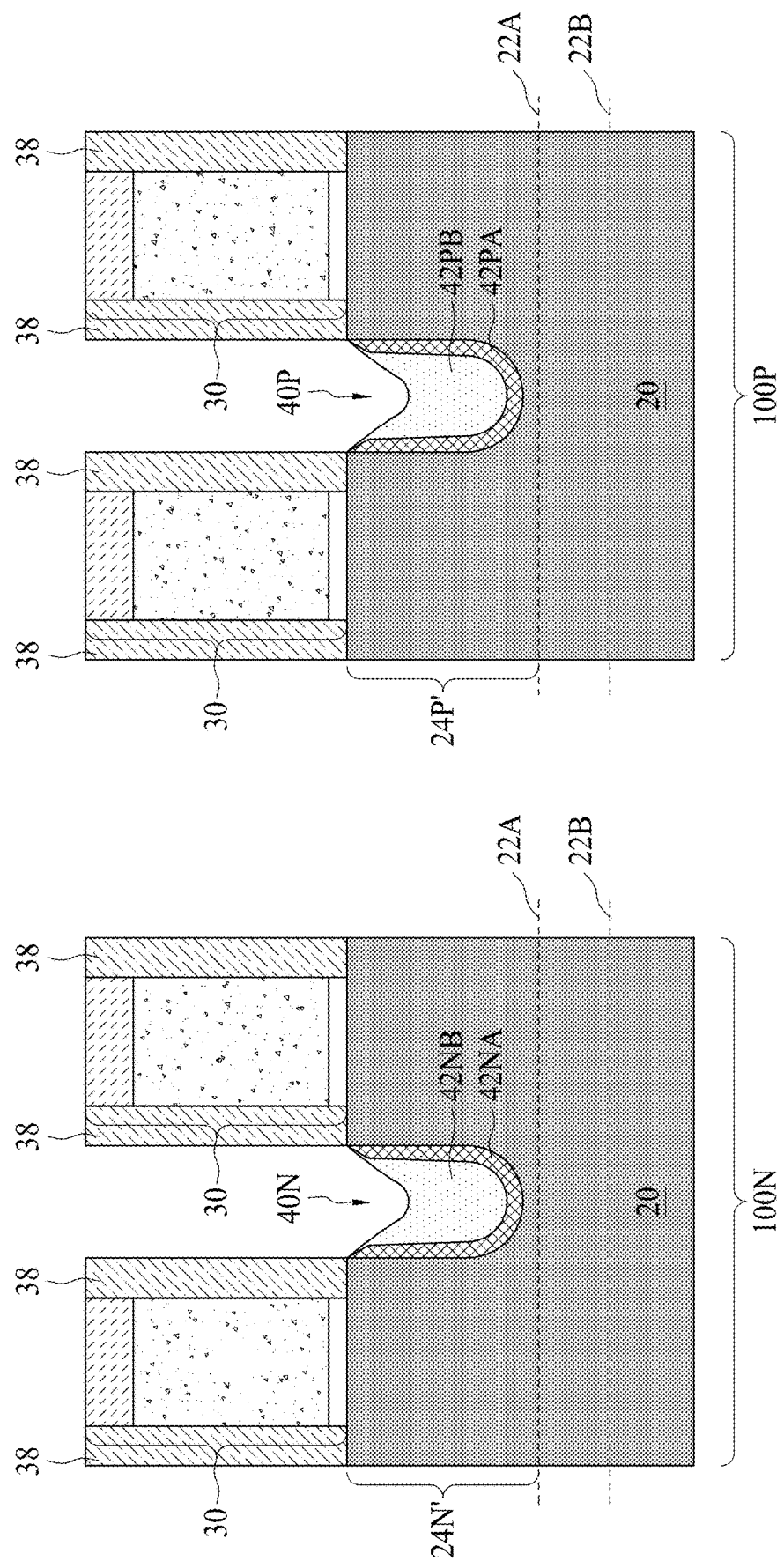
Figure 6B:
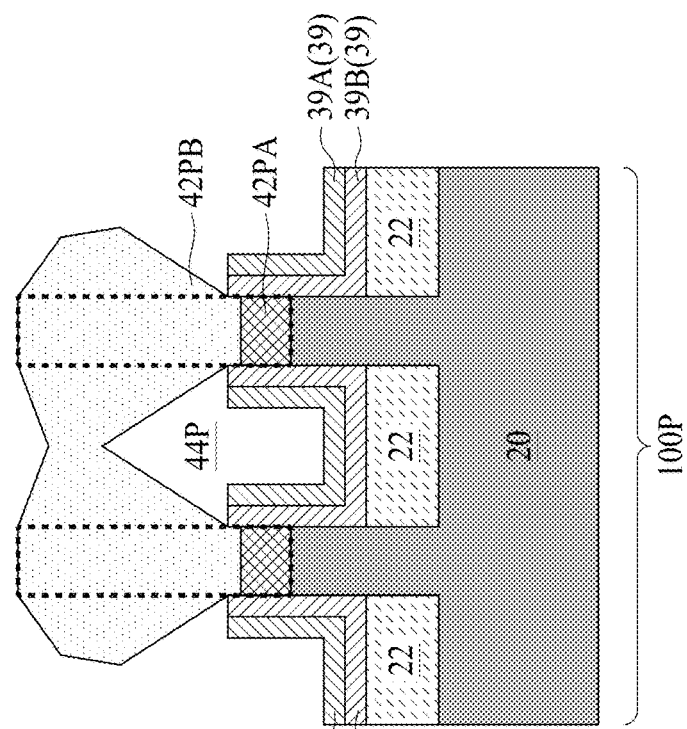
Figure 6B:
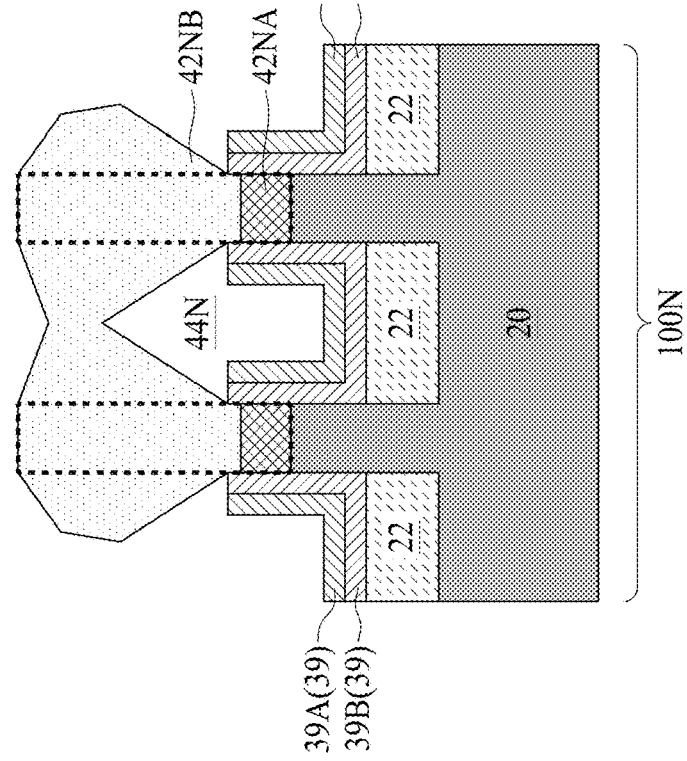

Referring to FIGS. 6A and 6B, second epitaxy layers 42NB are deposited. The deposition operation may be performed using RPCVD, PECVD, or the like. In accordance with some embodiments, the second epitaxy layer 42NB includes silicon doped with phosphorous, with the phosphorous having a second doping concentration greater than the first doping concentration in the first epitaxy layer 42NA. For example, the second doping concentration in the second epitaxy region 42NB may be in the range between about $5\times10^{20}$ atoms/cm$^3$ and about $5\times10^{21}$ atoms/cm$^3$ in accordance with some embodiments. The process gas for forming the second epitaxy layer 42NB may be similar to the process gas in the formation of the first epitaxy layer 42NA, except the flow rates of the process gases may be different from the flow rates of the corresponding process gases in the formation of first epitaxy layer 42NA.

Further referring to FIGS. 6A and 6B, second epitaxy layers 42PB are deposited. The deposition operation may be performed using RPCVD, PECVD, or the like. In accordance with some embodiments, the second epitaxy layer 42PB includes SiGeB with the boron having a second doping concentration greater than the first doping concentration of boron in the first epitaxy layer 42PA. For example, the boron doping concentration in the second epitaxy layer 42PB may be in the range between about $5\times10^{20}$ atoms/cm$^{-3}$ and about $5\times10^{21}$ atoms/cm$^3$ in accordance with some embodiments. Furthermore, the germanium atomic percentage in the second epitaxy layer 42PB is greater than the germanium atomic percentage in the first epitaxy layer 42PA. For example, the germanium atomic percentage in the second epitaxy layer 42PB may be in the range between about 20 percent and about 60 percent in accordance with some embodiments. The process gas for forming the second epitaxy layer 42PB may be similar to the process gas in the formation of the first epitaxy layer 42PA, except the flow rates of the process gases may be different from the flow rates of the corresponding process gases in the formation of the first epitaxy layer 42PA.

As shown in FIG. 6A, the top surfaces of the second epitaxy layer 42NB (42PB) are level with the top surfaces of protruding fins 24N' (24P'), while the middle portion of the top surface of the second epitaxy layer 42NB (42PB) is lower than the top surface of the protruding fins 24N' (24P'). As shown in FIG. 6B, the adjacent second epitaxy layers 42NB (42PB) grown from neighboring recesses are merged, with an air gap 44N (44P) being sealed under the merged second epitaxy layer 42NB (42PB). The top surface of the merged second epitaxy layer 42NB (42PB) may have a planar surface, non-planar surface, a wavy surface, or other surface shapes. The middle portion of the second epitaxy layer 42NB (42PB) between the adjacent protruding fins 24N' (24P') may be lower than the portions on opposite sides of the merged second epitaxy layer 42NB (42PB). In some embodiments, the grown second epitaxy layer 42NB and second epitaxy layer 42PB have the same or different top surface profiles.

Figure 7A:
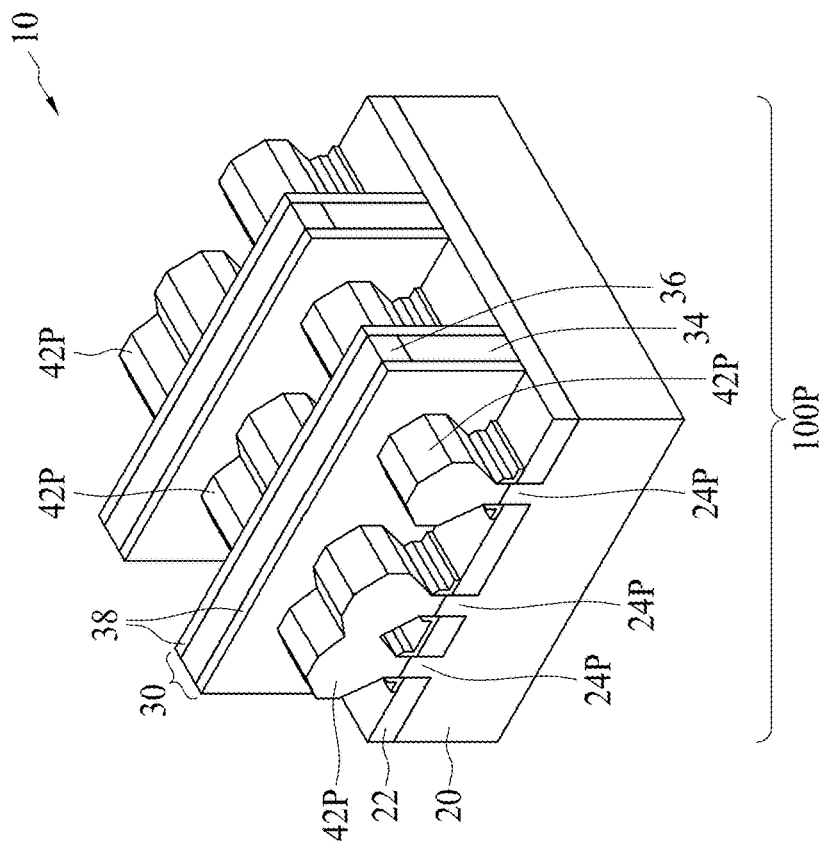
Figure 7A:
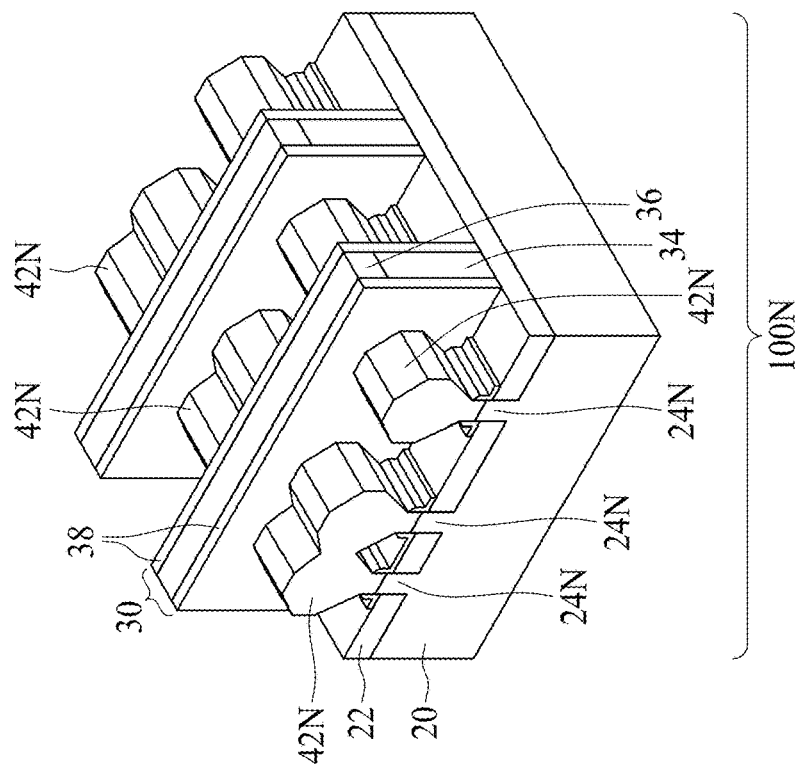
Figure 7B:
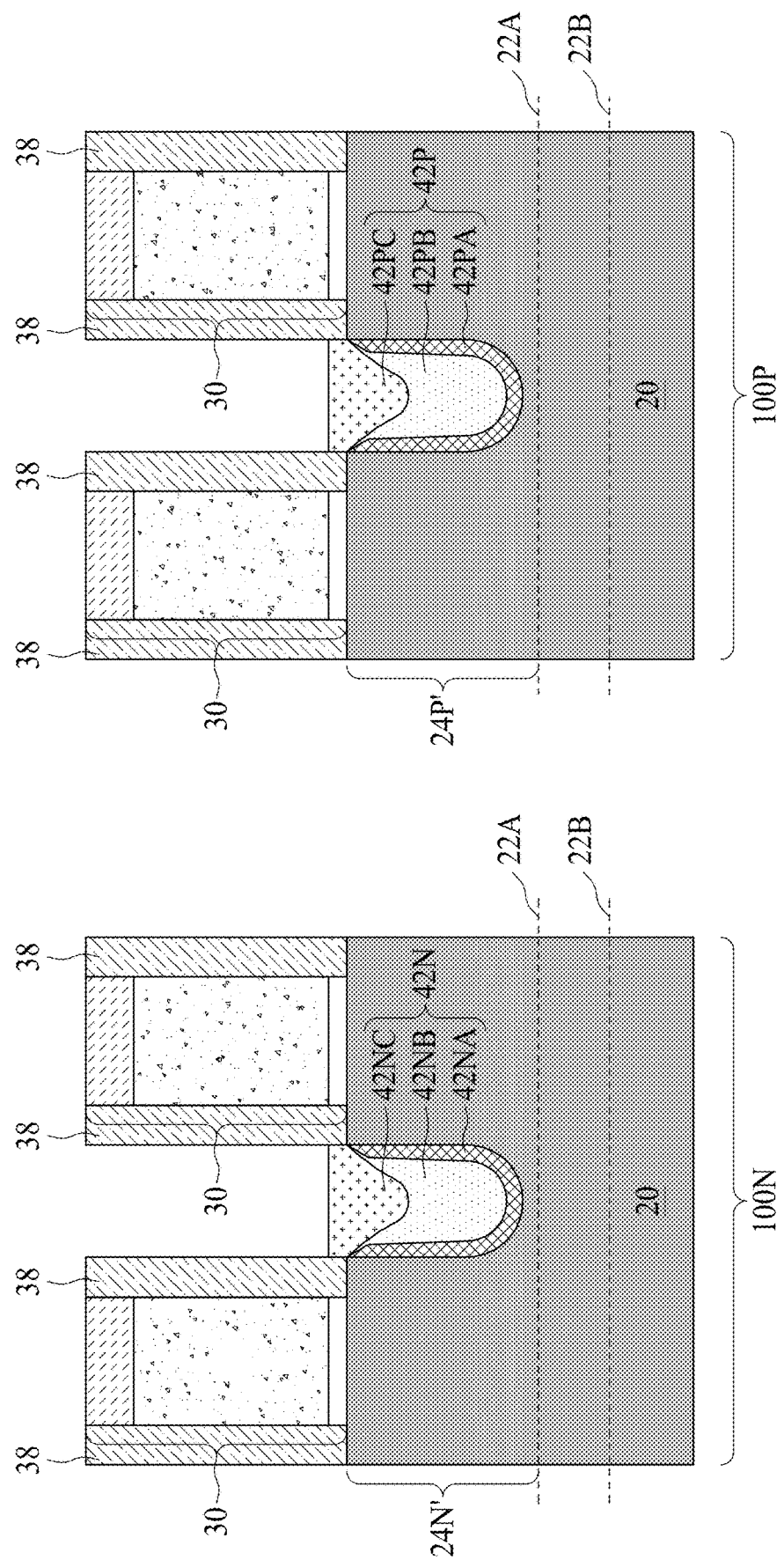
Figure 7C:
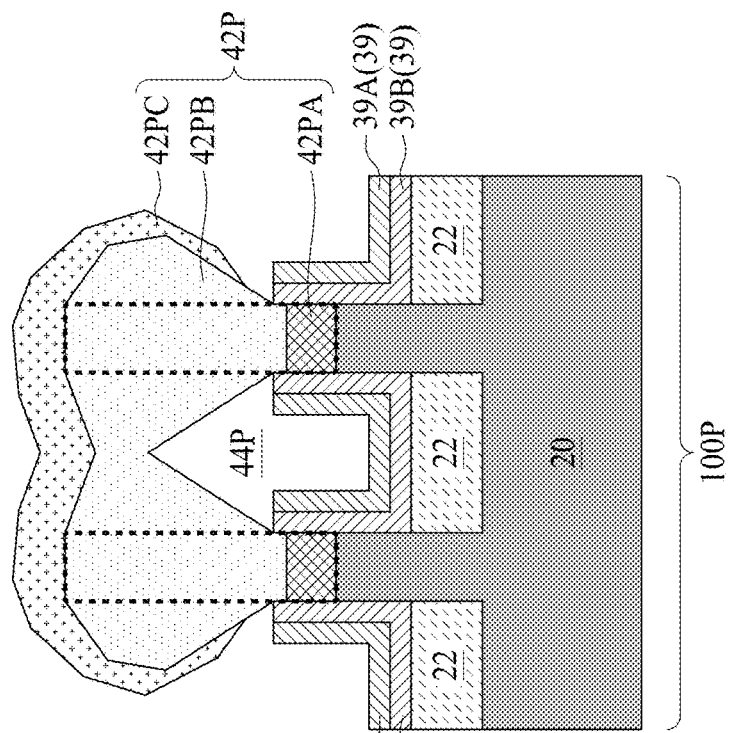
Figure 7C:
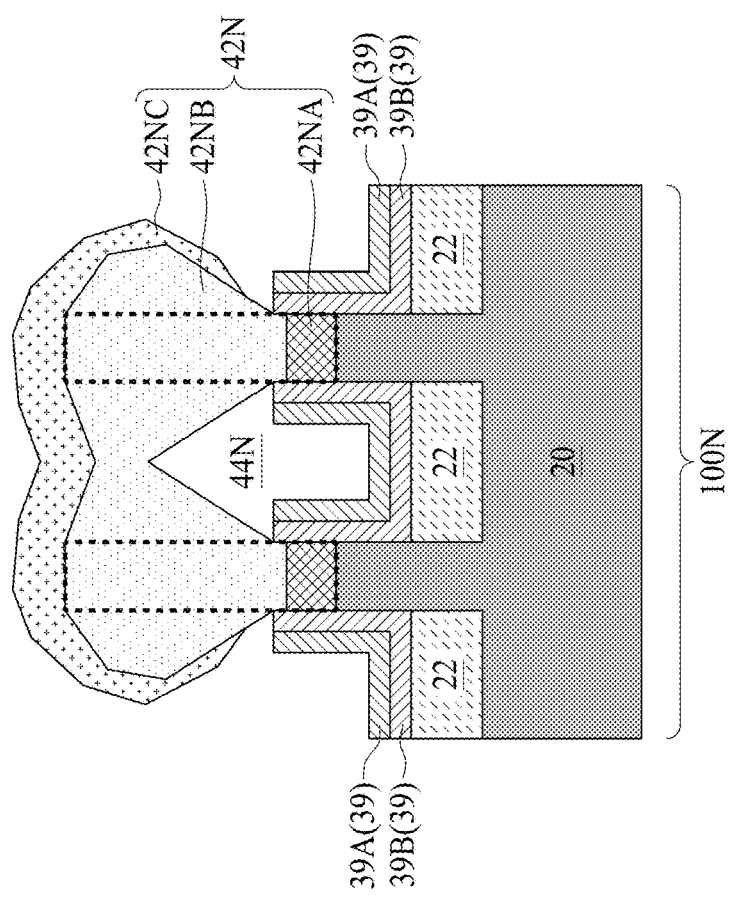

FIGS. 7A, 7B and 7C illustrate an epitaxy operation for depositing third epitaxy layers 42NC. The deposition operation may be performed using RPCVD, PECVD, or the like. In accordance with some embodiments, the third epitaxy layer 42NC includes silicon doped with N-type dopants, such as phosphorous, or other suitable dopants, e.g., arsenic, antimony, the like, or combinations thereof. The third epitaxy layer 42NC may not include germanium. In some embodiments, germanium is incorporated, for example, with a germanium atomic percentage in the range between about 1 percent and about 5 percent. In accordance with some embodiments, the phosphorous doping concentration in the third epitaxy layer 42NC is greater than the phosphorous doping concentrations in the first epitaxy layer 42NA and the second epitaxy layer 42NB. The doping concentration in the third epitaxy layer 42NC may be in the range between about $5\times10^{21}$ atoms/cm$^3$ and about $5\times10^{22}$ atoms/cm$^3$. The process gas for forming the third epitaxy layer 42NC may be similar to the process gas in the formation of the first and second epitaxy layers 42NA, 42NB. Throughout the present disclosure, the epitaxy layers 42NA, 42NB, and 42NC are collectively and individually referred to as epitaxy layers or epitaxy regions 42N, and are collectively referred to as source/drain regions 42N hereinafter.

FIGS. 7A, 7B and 7C further illustrate an epitaxy operation for depositing third epitaxy layers 42PC. The deposition operation may be performed using RPCVD, PECVD, or the like. In accordance with some embodiments, the third epitaxy layer 42PC includes SiGeB. In accordance with some embodiments, the boron concentration in the third epitaxy regions 42PC is greater than the boron concentrations in the first or second epitaxy regions 42PA or 42PB, and may be in the range between about $5\times10^{21}$ atoms/cm$^3$ and about $5\times10^{22}$ atoms/cm$^3$. Furthermore, the germanium atomic percentage in the third epitaxy layer 42PC is greater than the germanium atomic percentage in the second epitaxy layers 42PB. For example, the germanium atomic percentage in the third epitaxy layers 42PC may be in the range between about 40 percent and about 80 percent in accordance with some embodiments. Throughout the present disclosure, the epitaxy layers 42PA, 42PB, and 42PC are collectively and individually referred to as epitaxy layers (regions) 42P, which are collectively referred to as source/drain regions 42P hereinafter.

As shown in FIG. 7C, the top surface of the third epitaxy layer 42NC (42PC) maintains the non-planar or wavy shape, with the middle portion of the top surface of the epitaxy layer 42NC (42PC) being lower than opposite end portions. In some embodiments, the top surface of the third epitaxy layer 42NC (42PC) include a V-shaped portion. In some other embodiments, the top surfaces of the third epitaxy layer 42NC (42PC) has a planar shape or other shapes.

Figure 8A:
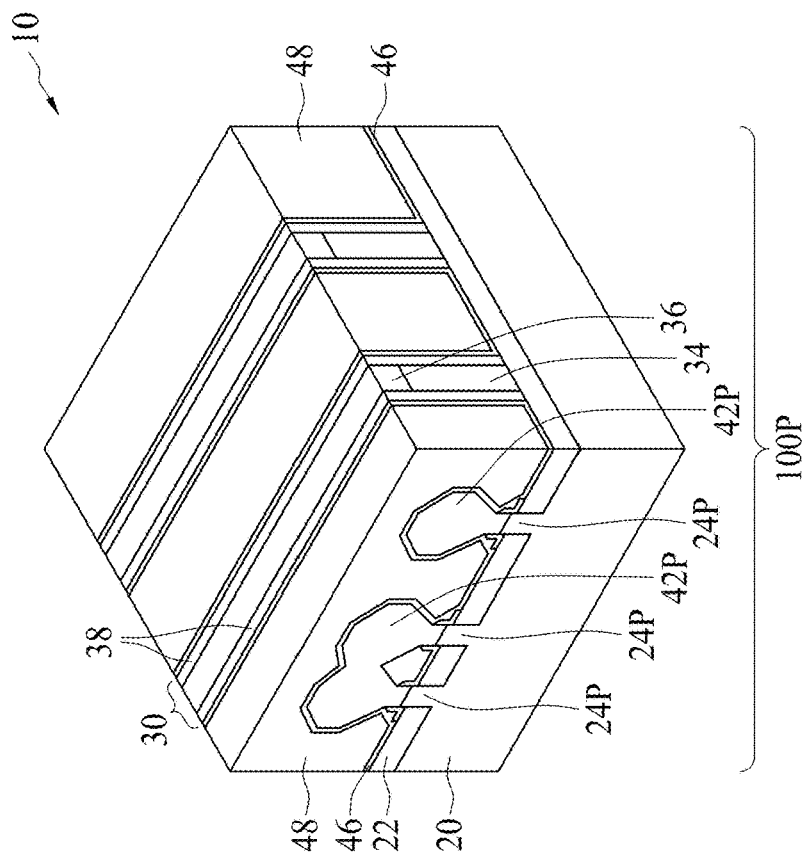
Figure 8A:
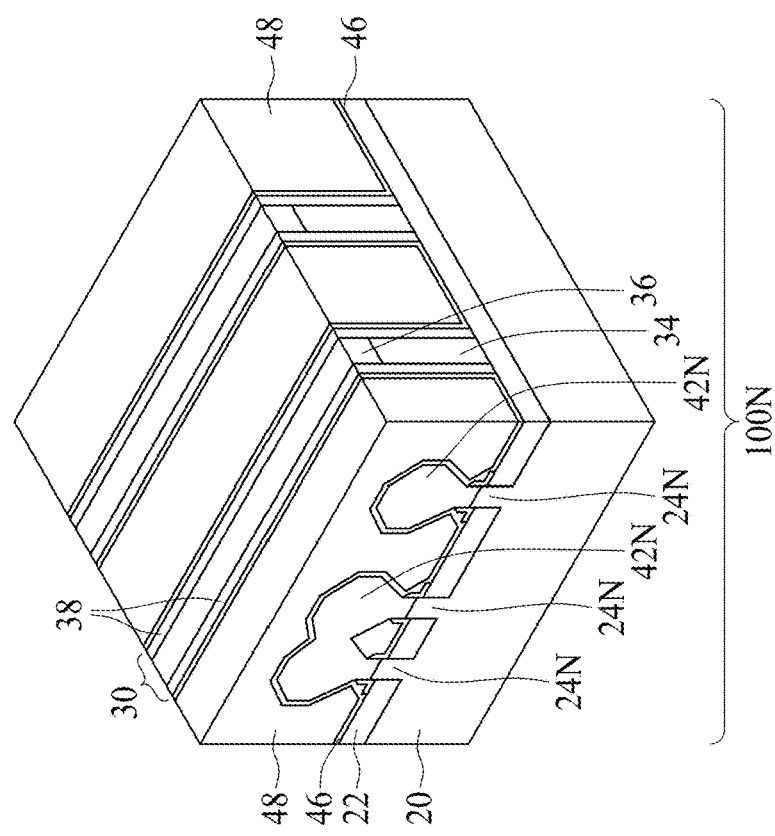
Figure 8B:
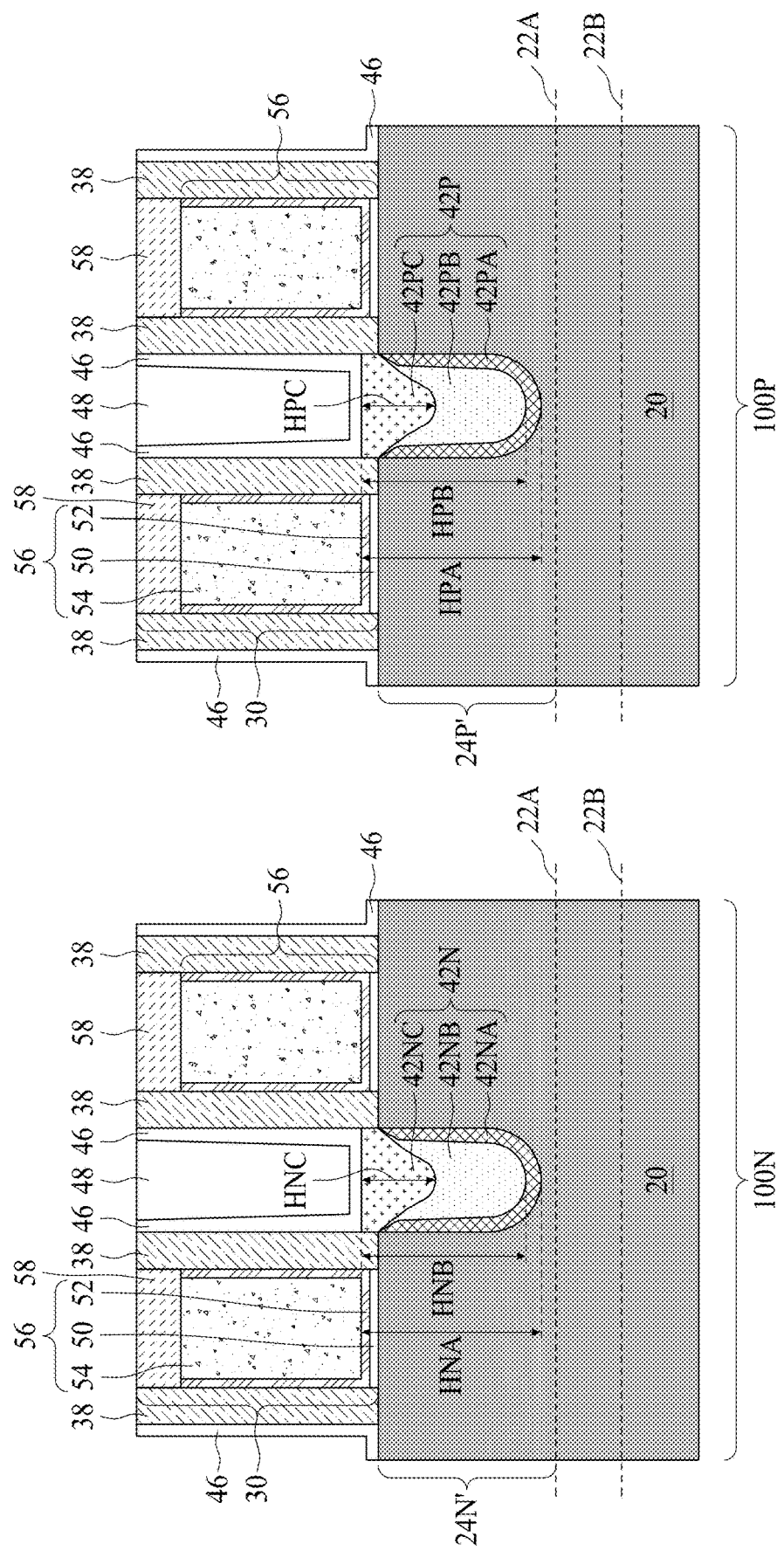
Figure 8C:
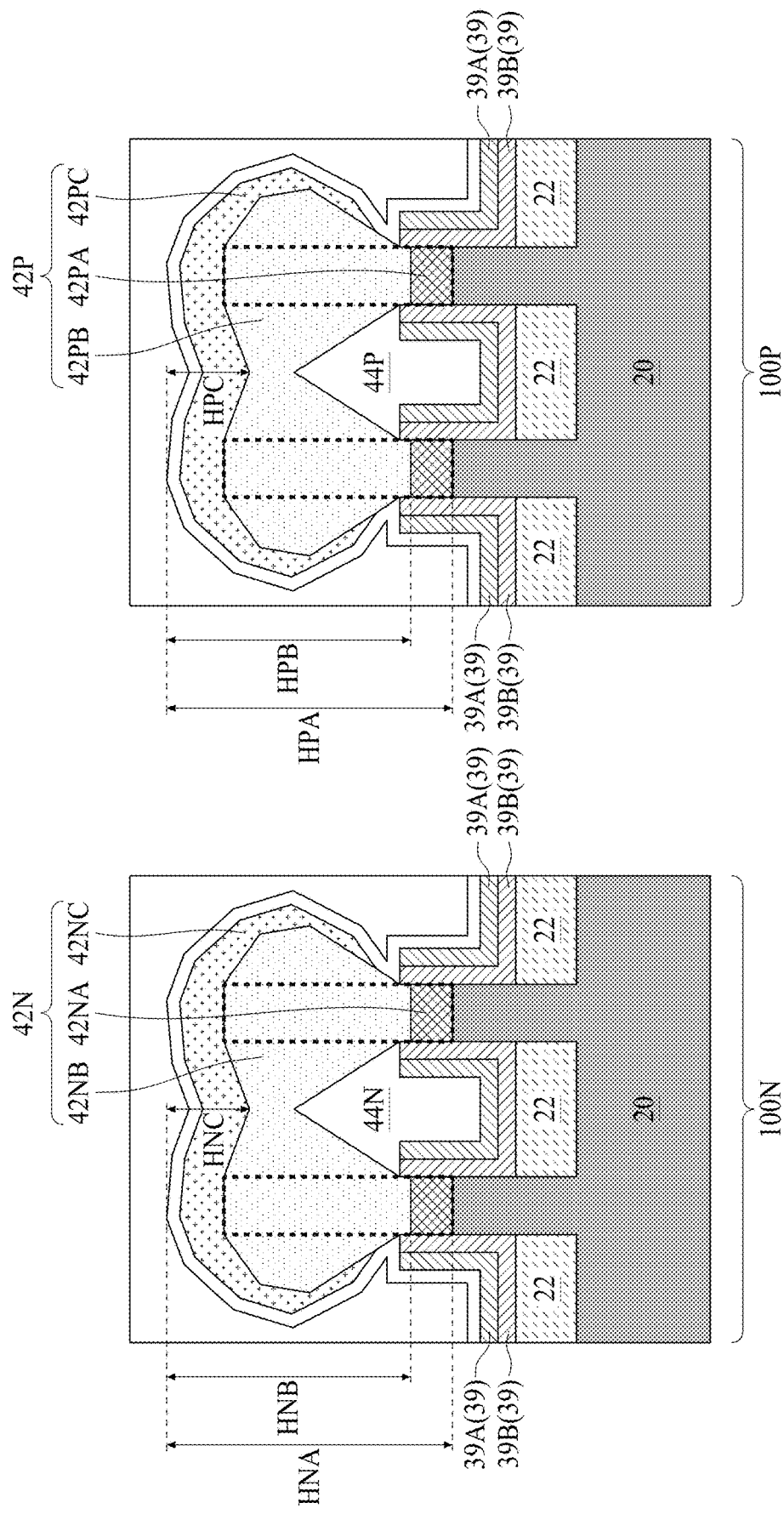

Referring to FIGS. 8A, 8B and 8C, a Contact Etch Stop Layer (CESL) 46 and an Inter-Layer Dielectric (ILD) layer 48 are formed over the epitaxy regions 42P and 42N. In some embodiments, the CESL 46 and the ILD layer 48 are formed of different materials, e.g., the CESL 46 and the ILD layer 48 are formed of silicon nitride and silicon oxide, respectively. The CESL 46 may be deposited over the epitaxy regions 42P and 42N and the gate spacers 38 in a conformal manner, while the ILD layer 48 is deposited over the CESL 46 and fills the recesses over the epitaxy regions 42P and 42N between and auxiliary gate stacks 30. As an example formation operation, the materials of the CESL 46 and the ILD layer 48 are formed over the epitaxy regions 42P and 42N and the auxiliary gate stacks 30. A planarization, such as Chemical Mechanical Planarization (CMP) or mechanical grinding, is performed to remove excess portions of the CESL 46 and the ILD layer 48, until the auxiliary gate stacks 30 are exposed.

The first epitaxy layers 42NA and 42PA have respective depths HNA and HPA, measured from the top surfaces of the respective n-type/p-type source/drain regions 42N/42P to their respective bottoms. Similarly, the second epitaxy layers 42NB and 42PB have respective depths HNB and HPB, measured from the top ends of the respective n-type/p-type source/drain regions 42N/42P to their respective bottoms. The third epitaxy layers 42NC and 42PC has respective depths HNC and HPC, measured from the top surfaces of the respective n-type/p-type source/drain regions 42N/42P to their respective bottom surfaces in a central portion over and surrounded by the second epitaxy layers 42NB and 42PB. In some embodiments, the heights HNA and HPA are in a range between about 50 nm and about 80 nm. In some embodiments, the heights HNB and HPB are in a range between about 12 nm and about 50 nm. In some embodiments, the heights HNC and HPC are in a range between about 10 nm and about 30 nm.

Figure 9:
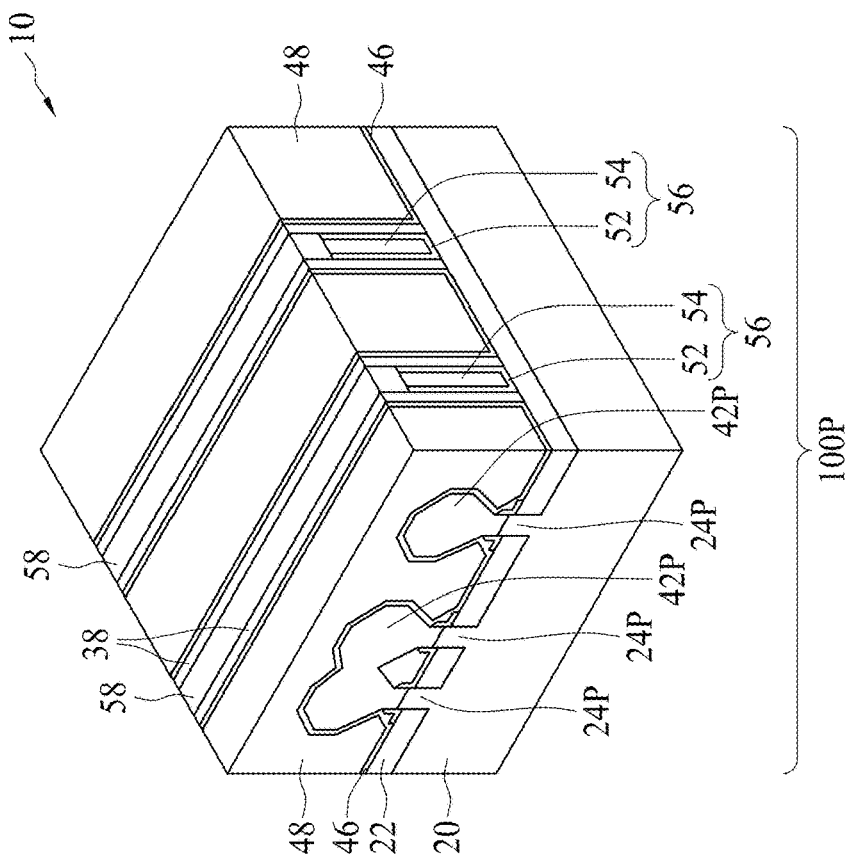
Figure 9:
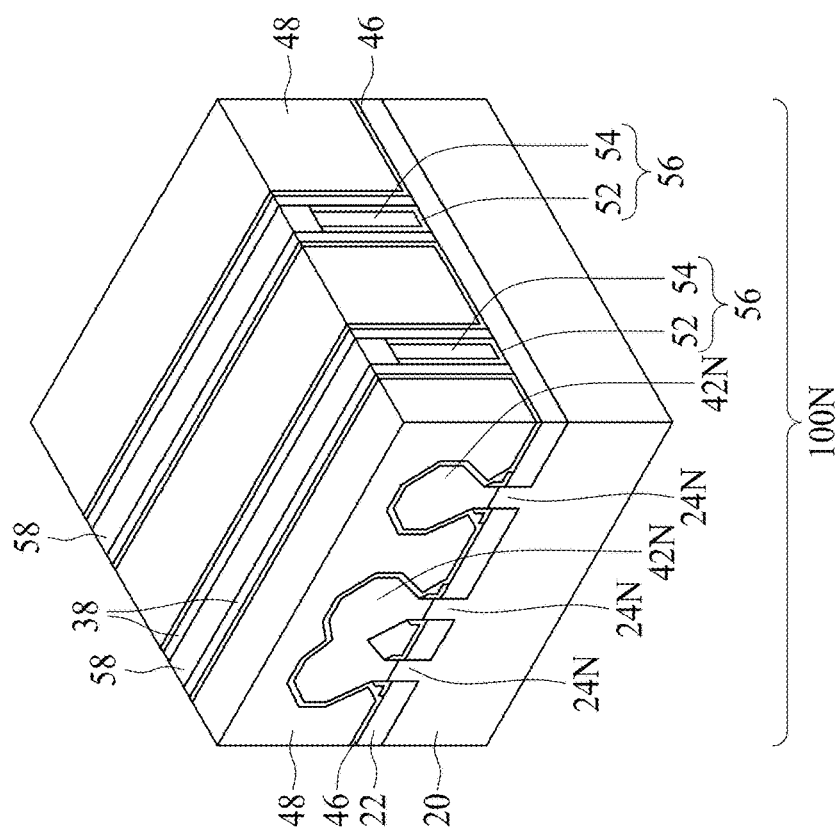

Referring to FIG. 9, the auxiliary gate stacks 30 are replaced with replacement gate stacks 56. In some embodiments, the replacement gate stacks 56 include gate dielectrics 52, which further include interfacial layers on the top surfaces and sidewalls of protruding fins 24', and high-k dielectric layers on the interfacial layers. Replacement gate stacks 56 may further include gate electrodes 54 over the high-k dielectric layers 52. The gate electrodes 54 may be formed as n-type or p-type electrodes in the respective n-type and p-type device regions 100N, 100P, and may include one or more metal layers, e.g., tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), titanium nitride (TiN), tantalum nitride (TaN), a combination thereof, or other suitable materials. After the formation of replacement gate stacks 56, replacement gate stacks 56 are recessed to form trenches between the gate spacers 38. A dielectric material such as silicon nitride, silicon oxynitride, or the like, is filled into the resulting trenches to form hard masks 58.

Figure 10A:
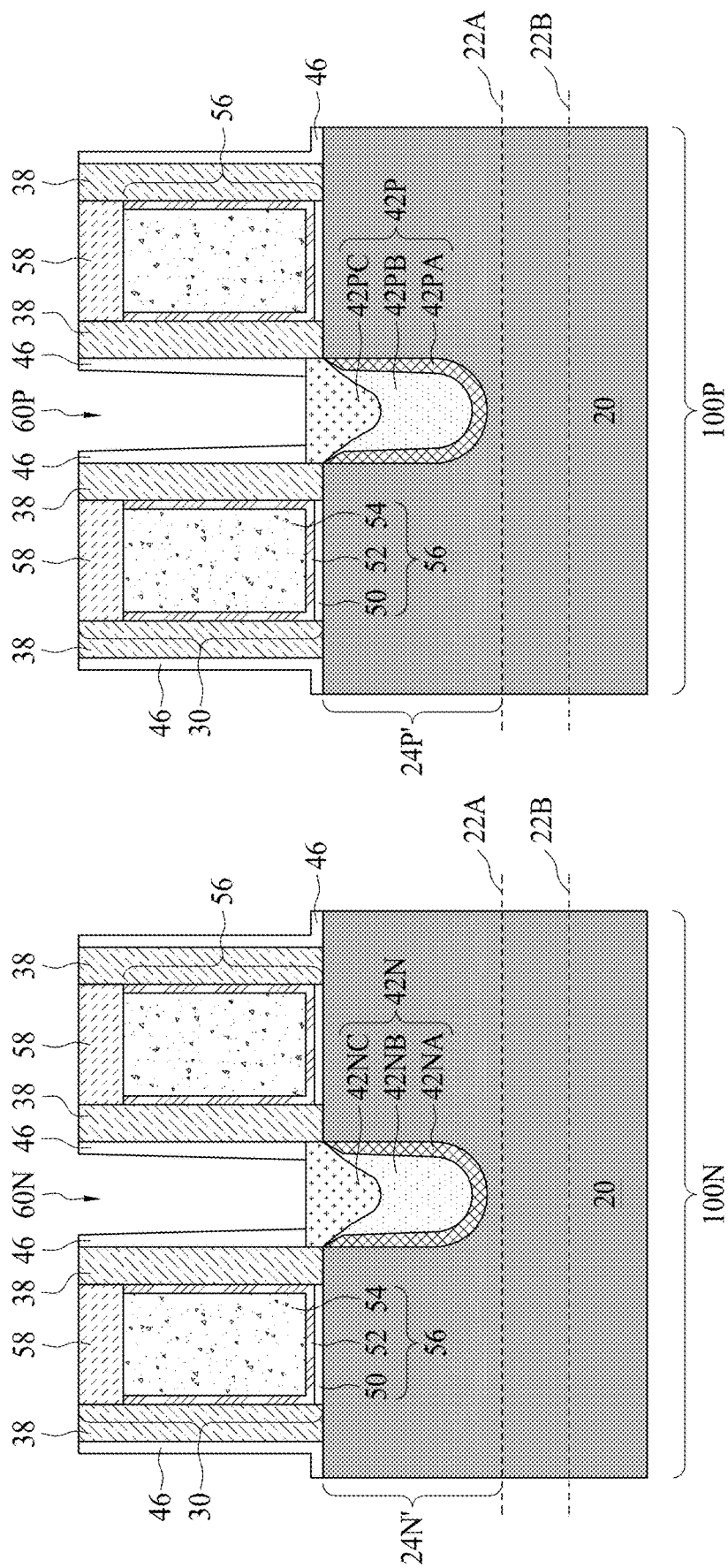
Figure 10B:
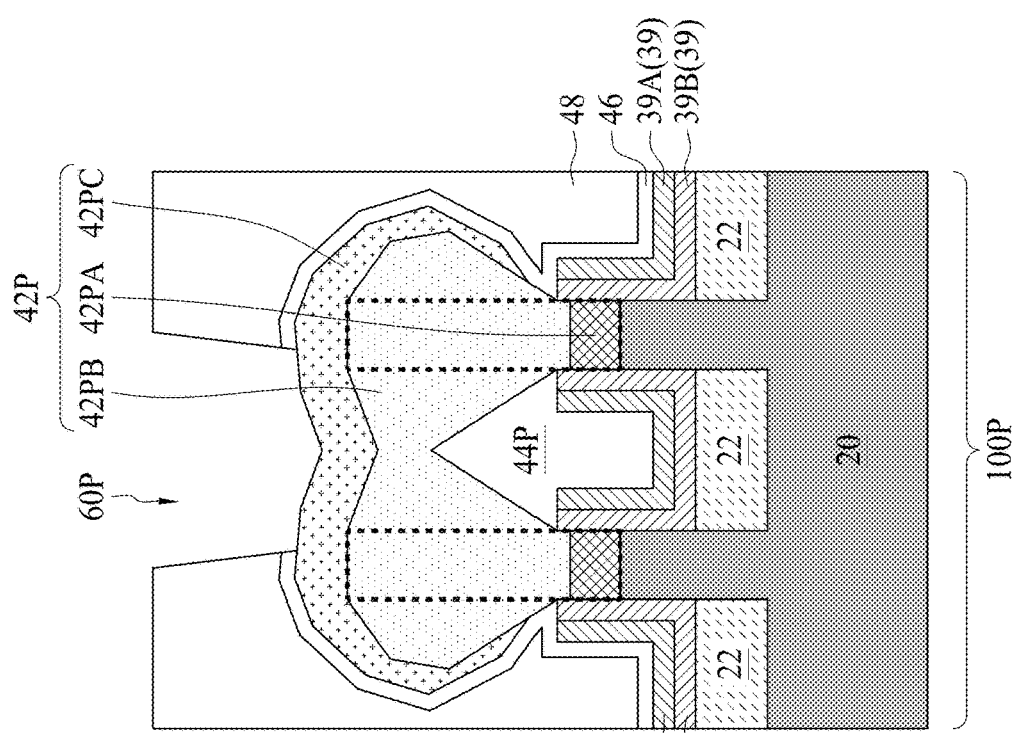
Figure 10B:
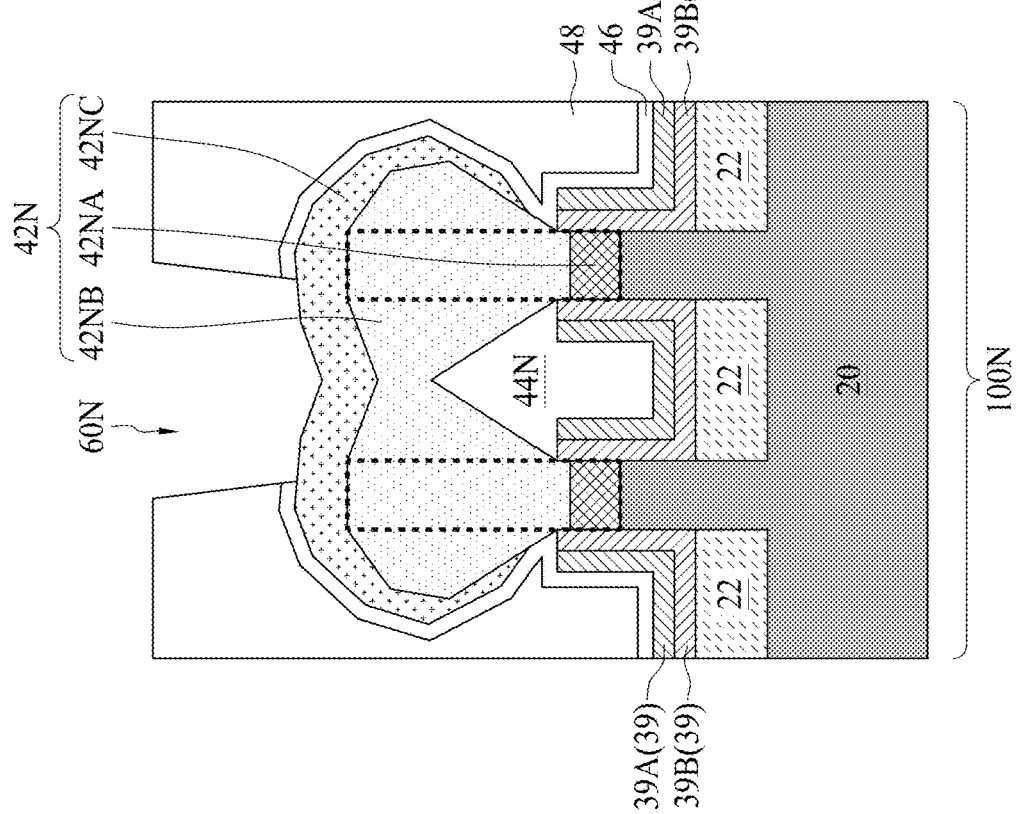

Referring to FIGS. 10A and 10B, the ILD layer 48 and CESL 46 are etched to form recesses 60N and 60P, so that the epitaxy layers 42N and 42P are exposed. The etch operation may include a dry etch, which may be an anisotropic etch. In some embodiments, the etching of the ILD layer 48 and the CESL 46 involves one or more etching steps to etch the ILD layer 48 and the CESL 46 separately. In some embodiments, the ILD layer 48 is fully removed during the etching operation, while the CESL 46 is partially removed to expose the upper surfaces of the epitaxy layers 42N and 42P and leave vertical portions of the CESL 46 on the gate spacers 38. In some embodiments, the third epitaxy layers 42NC and 42PC are kept substantially intact, or their etched amounts are negligible, during the etch operation. In some embodiments the ILD layer 48 is completely removed, and thus the sidewalls of the etched CESL 46 define the recesses 60N and 60P, which are to be filled in forming conductive plugs 66 later. The conductive plugs 66, which serve as source/drain contact plugs, can have a sufficiently large plug width so that the contact resistance can be reduced. The vertical portions of the CESL 46 remains on the sidewalls of the gate spacers 38 for protecting the replacement gate stacks 56 from damage during the subsequent processing steps.

Figure 11A:
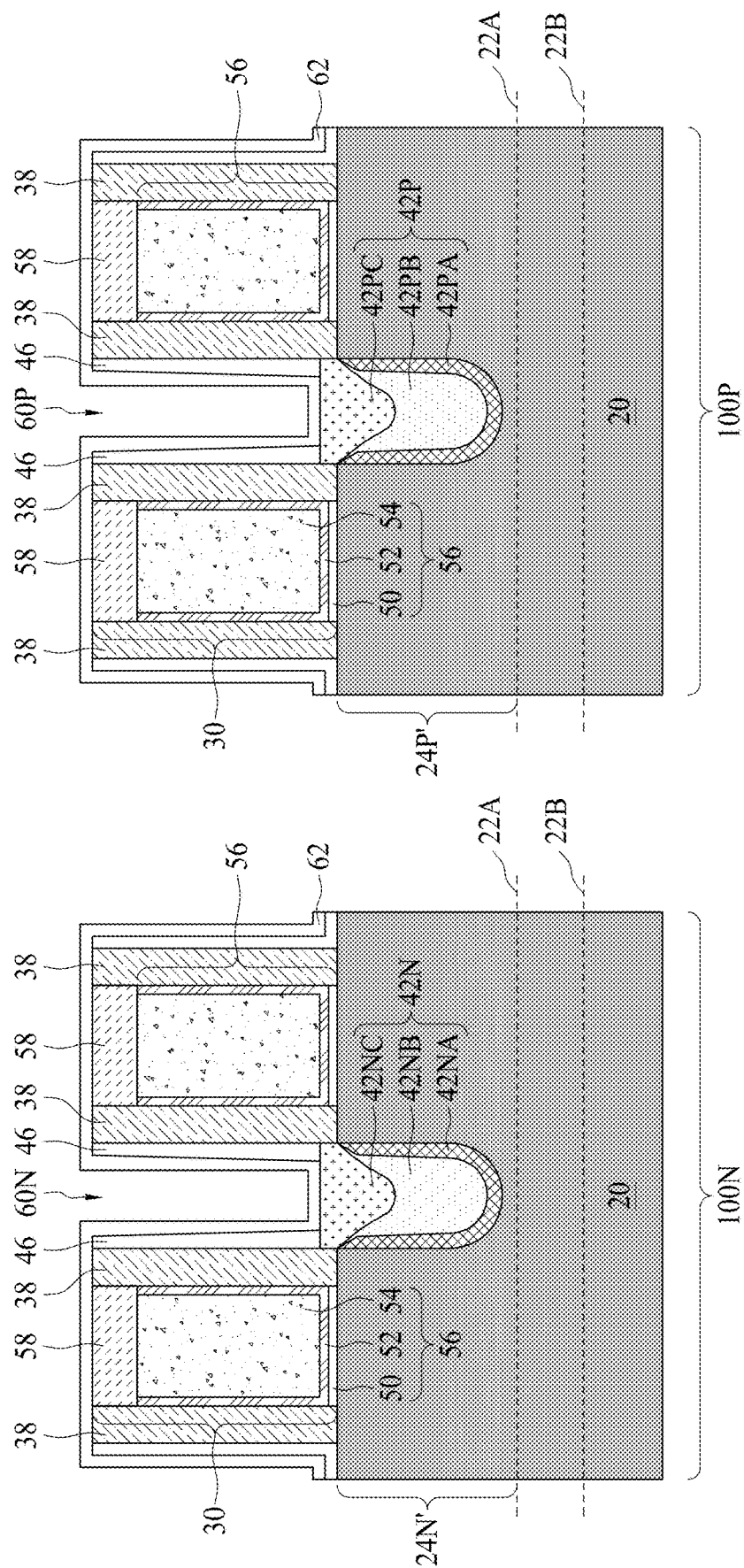
Figure 11B:
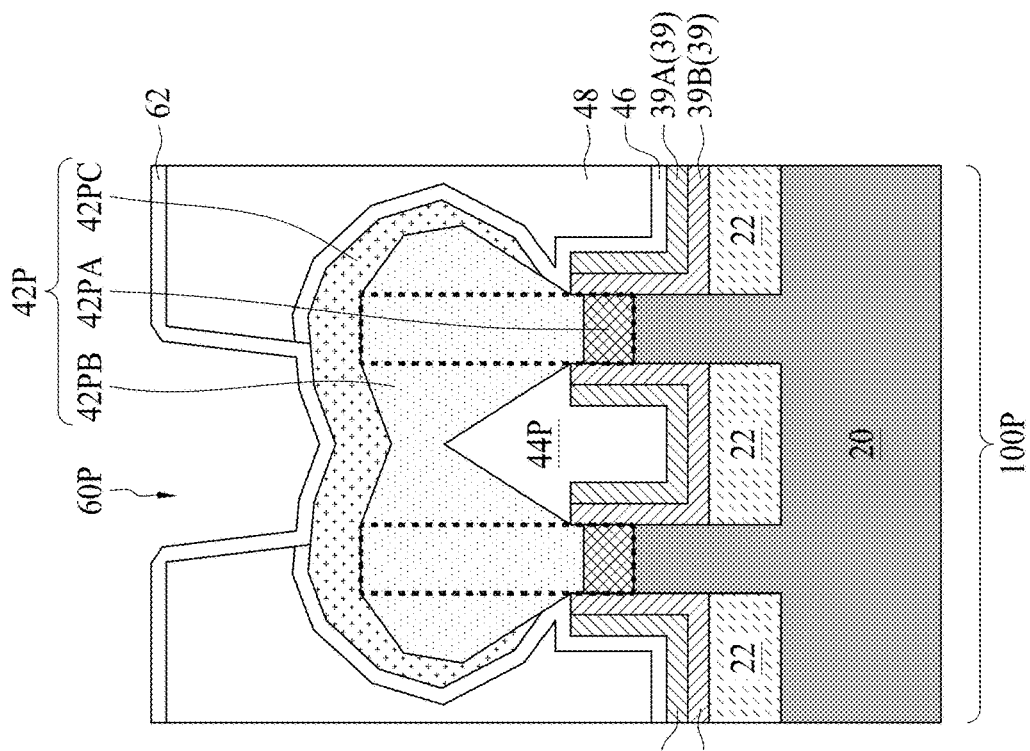

Referring to FIGS. 11A and 11B, a protection layer 62 is deposited over the ILD layer 48 and the CESL 46. In some embodiments, the protection layer 62 is used to protect the replacement gate stacks 56 from damage during subsequent etching operations. The protection layer 62 may include a dielectric material similar to the CESL 46, e.g., silicon nitride or silicon oxynitride. The protection layer 62 is deposited on sidewalls and bottom surfaces of the recesses 60N, 60P in a conformal manner. The exposed upper surfaces of the third epitaxy layers 42NC and 42PC are covered by the protection layer 62.

Figure 12A:
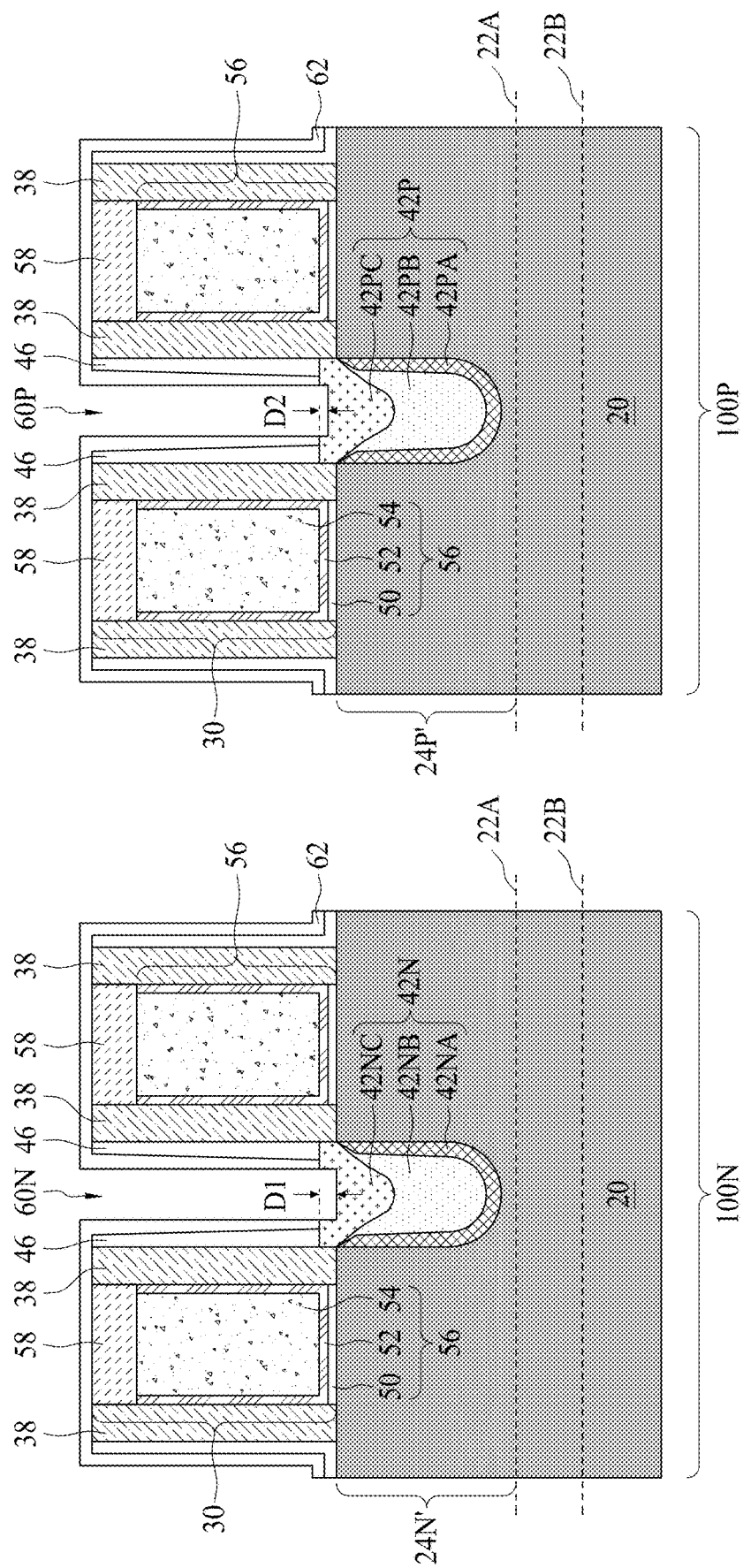
Figure 12B:
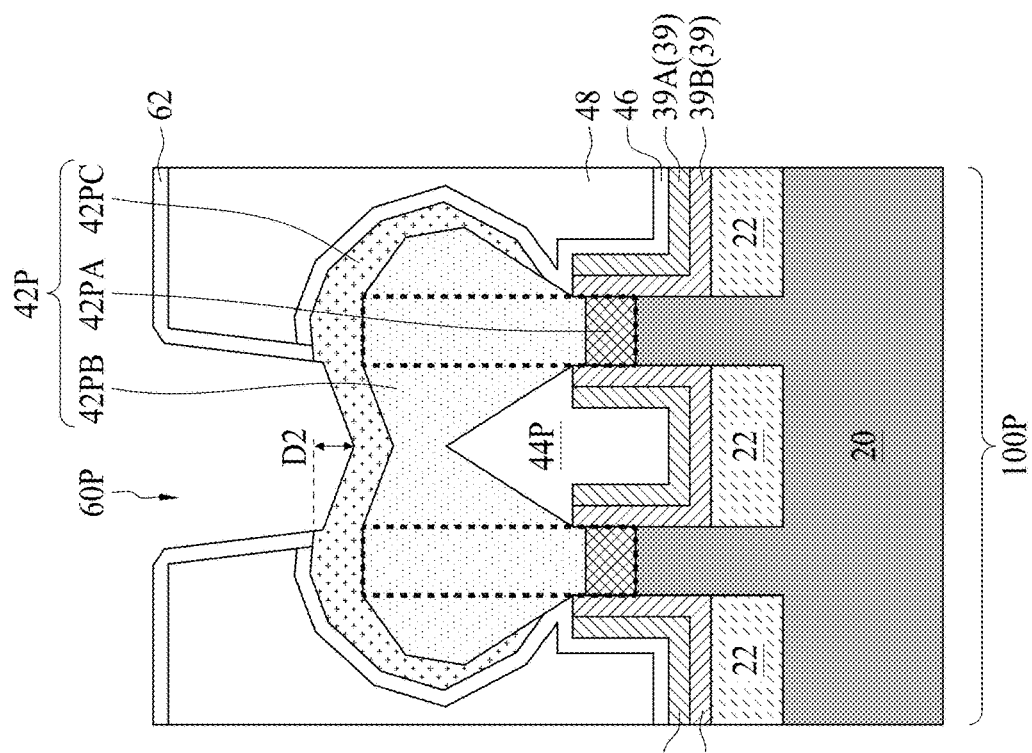
Figure 12B:
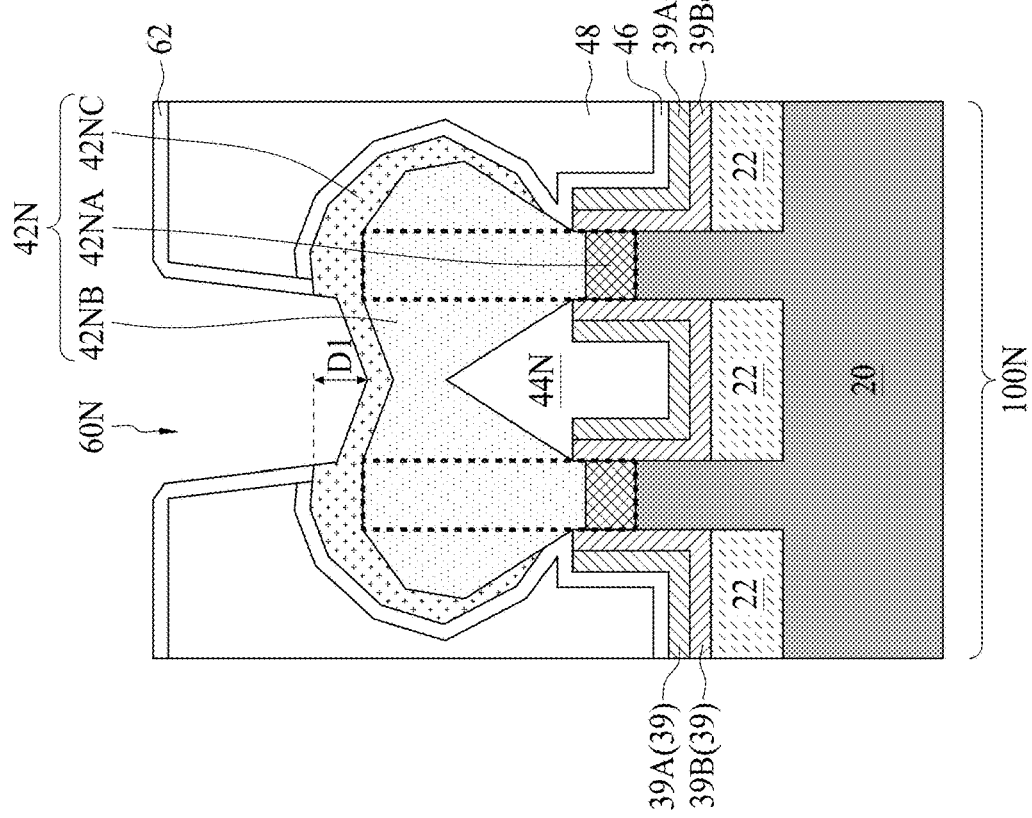

FIGS. 12A and 12B illustrate an etching operation on the third epitaxy layers 42NC and 42PC to extend the recesses 60N and 60P further into predetermined depths of the third epitaxy layers 42NC and 42PC, respectively. In some embodiments, the etching operation includes a dry etching and introduces a process gas, e.g., fluorine-based gas, for etching through the protection layer 62 and the third epitaxy layers 42NC and 42PC. In some embodiments, the etching of the protection layer 62 is anisotropic to provide an etching rate on a bottom portion of the protection layer 62 greater than an etching rate on vertical portions of the protection layer 62, such that sidewalk of the protection layer 62 are substantially retained during the etching operation.

In some embodiments, the etching operation etches the recesses 60N and 60P at the same time, e.g., using a single etching operation, and performs a selective etching on the different materials of the third epitaxy layers 42NC and 42PC to thereby form a first depth D1 of the third epitaxy layers 42NC and a second depth D2 of the third epitaxy layer 42PC. The first depth D1 is measured from a topmost surface of the third epitaxy layer 42NC to a bottom surface of the recess 60N, while the second depth D2 is measured from a topmost surface of the third epitaxy layer 42PC to a bottom surface of the recess 60P. The first depth D1 is greater than the second depth D2. The selective etching may be performed by a dry etch, in which the etchant gas includes a fluorine-based gas, e.g., CxHyFz, in which x, y, and z are integers. The etching may be anisotropic. In some embodiments, the etchant gas further includes carbonyl sulfide (COS) to cause an etching rates on the third epitaxy layer 42NC greater than the etching rate on the third epitaxy layer 42PC. In some embodiments, a flow rate ratio of the COS to the fluorine-based etchant gas is in a range between about 5% and about 70%. The etching operation may be performed under a pressure in a range between about 2 mTorr and about 50 mTorr, and at a process temperature between about 100 degrees Celsius and about 150 degrees Celsius. The etching time may be controlled between about 1 second and about 20 seconds. With help of the COS used in the process gas, the different values of the first depth D1 and the second depth D2 can be achieved in a single etching operation.

The first depth D1 is measured from the top of the third epitaxy layer 42NC to the bottom of the recess 60N, and the second depth D2 is measured from the top of the third epitaxy layer 42PC to the bottom of the recess 60P. In some embodiments, the selective etching causes the first depth D1 to be greater than the second depth D2 by a depth difference Dx of at least 2 nm. In some embodiments, the depth difference Dx is between about 2 nm and about 10 nm, between about 2 nm and about 8 nm, or between about 2 nm and about 6 nm. In some embodiments, the selective etching does not run through the third epitaxy layers 42NC and 42PC. In other words, the bottoms of the recesses 60N and 60P are within the respective third epitaxy layers 42NC and 42PC. In some embodiments, a ratio between the depth difference Dx and the height HNC of the third epitaxy layer 42NC is between about 10% and about 40%, between about 20% and about 40% or between about 20% and about 30%.

Figure 13A:
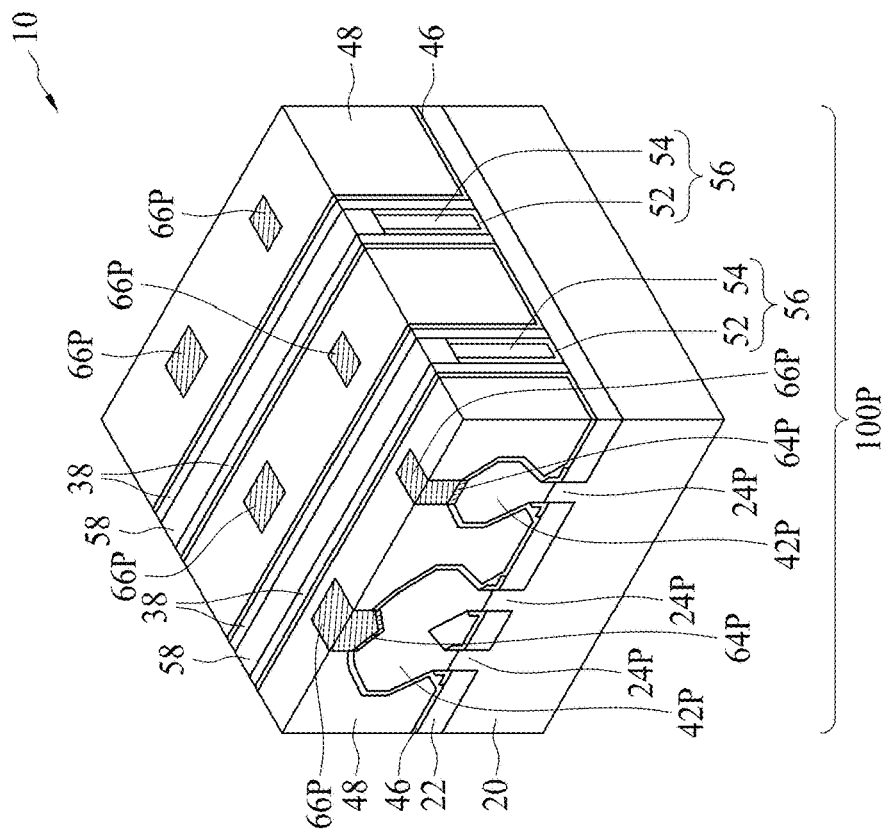
Figure 13A:
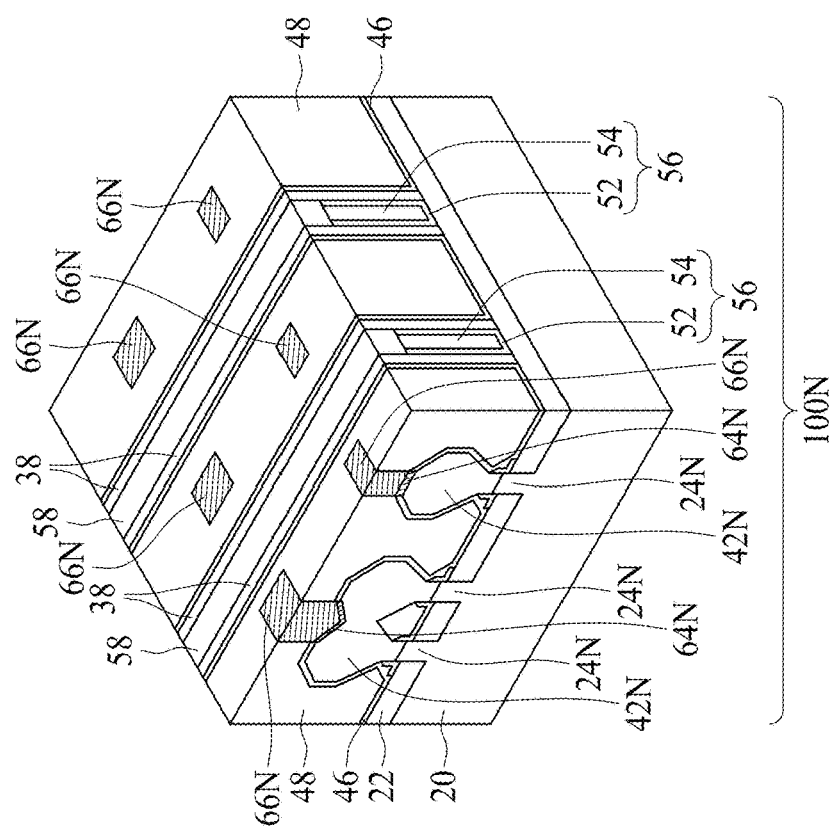
Figure 13B:
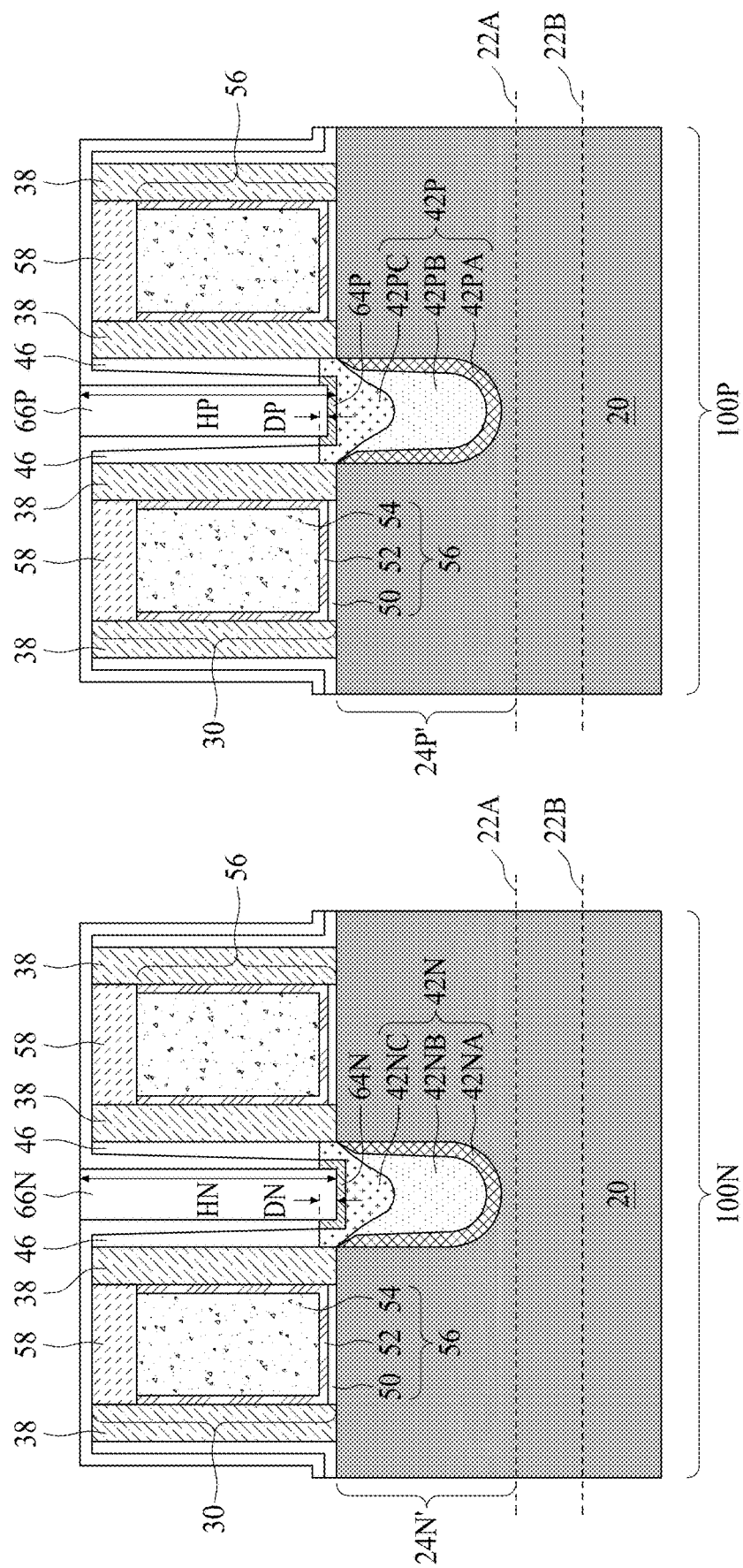
Figure 13C:
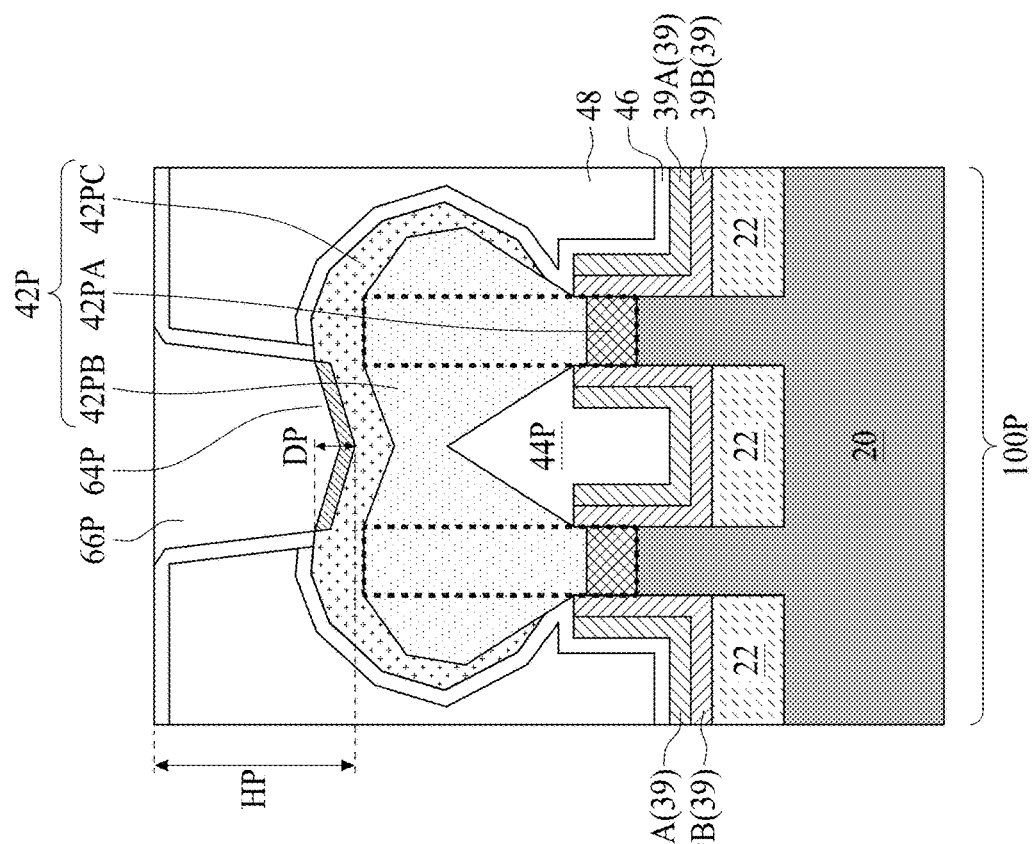
Figure 13C:
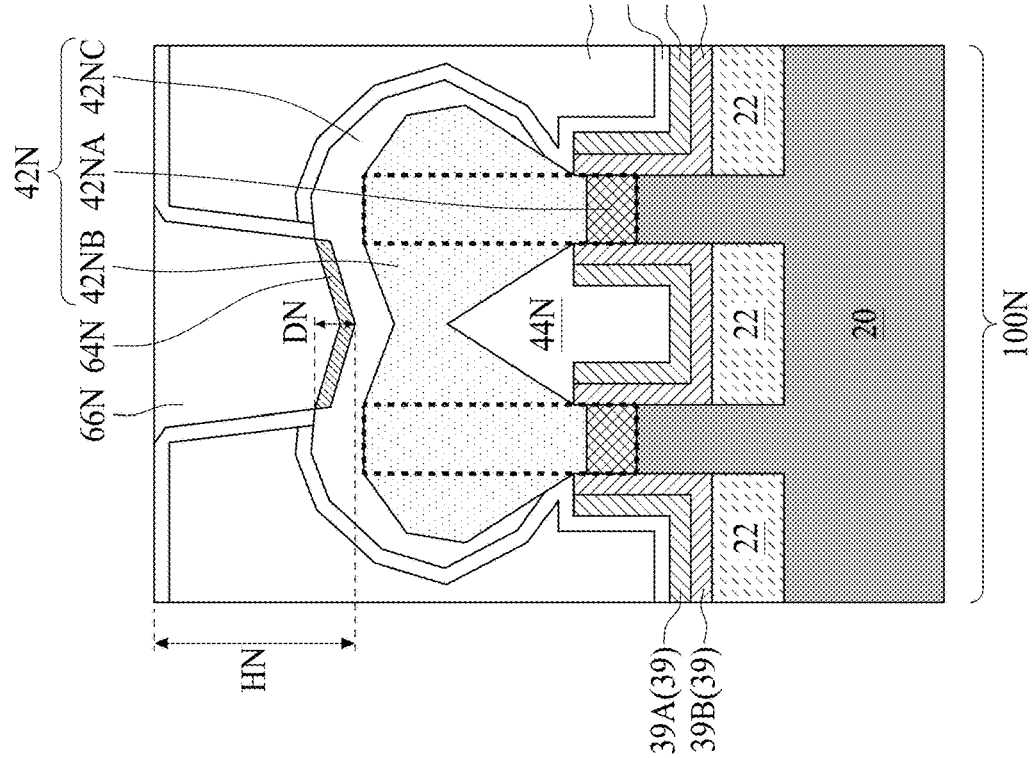

Referring to FIGS. 13A, 13B and 13C, silicide regions 64N and 64P and the conductive plugs 66N and 66P are formed. In accordance with some embodiments of the present disclosure, the formation of the silicide regions 64N and 64P includes depositing a metal layer such as a titanium layer, a cobalt layer, or the like, extending into both of recesses 60N and 60P, and then performing an annealing process so that the bottom portions of the metal layer react with the third epitaxy layers 42NC and 42PC to form the silicide regions 64N and 64P, respectively. The remaining un-reacted metal layer may be removed. The conductive plugs 66N and 66P are then formed in recesses 60N and 60P, respectively, and are electrically connected to the respective source/drain silicide region 64N and 64P, respectively. An n-type FinFET and a p-type FinFET are thus formed in the n-type device region 100N and the p-type device region 100P, respectively.

In some embodiments, due to the first depth D1 being greater than the second depth D2 by the depth difference Dx, the conductive plug 66N has a height HN greater than a height HP of the conductive plug 66P by a height difference Hx, wherein the height HN is measured from a top surface of the conductive plug 66N to a bottom surface of the conductive plug 66N, and the height HP is measured from a top surface of the conductive plug 66P to a bottom surface of the conductive plug 66P. In some embodiments, the height difference fix is at least about 2 nm, e.g., in a range between about 2 nm and 10 nm, between about 2 nm and about 8 nm and between about 2 nm and about 6 nm. In some embodiments, a ratio between the height difference Hx and the height HNC of the third epitaxy layer 42NC is between about 10% and about 40%, between about 20% and about 40% or between about 20% and about 30%.

In some embodiments, the conductive plug 66N extends into the third epitaxy layer 42NC by a height DN, and the conductive plug 66P extends the third epitaxy layer 42NP by a height DP, wherein the height DN is greater than the height DP by at least about 2 nm, in a range between about 2 nm and 10 nm, between about 2 nm and about 8 nm and between about 2 nm and about 6 nm.

The embodiments of the present disclosure provides advantages. In some embodiments, the p-type source/drain regions 42P are formed, e.g., including germanium, to exert stress on the channel region of the p-type FinFET to improve the FinFET performance. In some embodiments, the n-type source/drain regions 42N are formed to not exert stress on the channel region of the n-type FinFET. The disparate stress arrangement on the n-type and p-type FinFET channel regions leads to different design requirements of the depths D1 and D2. Generally, when the first depth D1 or the second depth D2 is made greater, the contact resistance between the source/drain region 42N and the conductive plug 66N or between the source/drain region 42P and the conductive plug 66P will be decreased, as long as the first depth D1 or the second depth D2 does not run into the second epitaxy layer 42NB or 42PB. That is because the lower doping concentration in the second epitaxy layers 42NB and 42PB will otherwise increase the contact resistance. However, when the second depth D2 is formed greater than about 8 nm while being within the third epitaxy layer 42PC, the material loss of the third epitaxy layer 42PC will decrease the stress exerted on the channel region of the p-type FinFFT, thereby increasing the channel resistance of the p-type FinFFT. As a result, the second depth D2 of the conductive plug 66P within the third epitaxy layer 42PC should be determined to seek a balance between the channel resistance and the contact resistance of the conductive plug 66P. Existing methods of forming the conductive plugs 66N and 66P may cause the second depth D2 to be greater than the first depth D1 to compensating for the inferior conduction performance of the p-type FinFFT as compared to the n-type FinFFT without considering the impact of the channel resistance of p-type FinFFT. Through the embodiments of the present disclosure, the overall resistance of the p-type FinFFT will be further decreased, thereby improving the performance of the p-type FinFFT.

In some embodiments, the determination factor of the first depth D1 and the second depth D2 includes at least one of following: the doping concentrations of the n-type source/drain regions 42N and p-type source/drain regions 42P, the germanium atomic percentage in the p-type source/drain layers 42P, the etching selectivity of the etchant gas used to etch the first depth and the second depth, a first width of the first recess, a second width of the second recess, the channel resistance of the p-type FinFFT, and the stress level exerted on the channel region of the p-type FinFFT.

FIGS. 14A, 14B, 15A and 15B illustrate the cross-sectional views of intermediate stages in the formation of an n-type Fin Field-Effect Transistor (FinFET) and a p-type FinFET in accordance with some embodiments. The formation process shown in FIGS. 14A, 14B, 15A and 15B follows the stage shown in FIG. 9, where the replacement gate stacks 56 are formed, and illustrate an alternative embodiment of etching the recesses 60N and 60P.

Figure 14A:
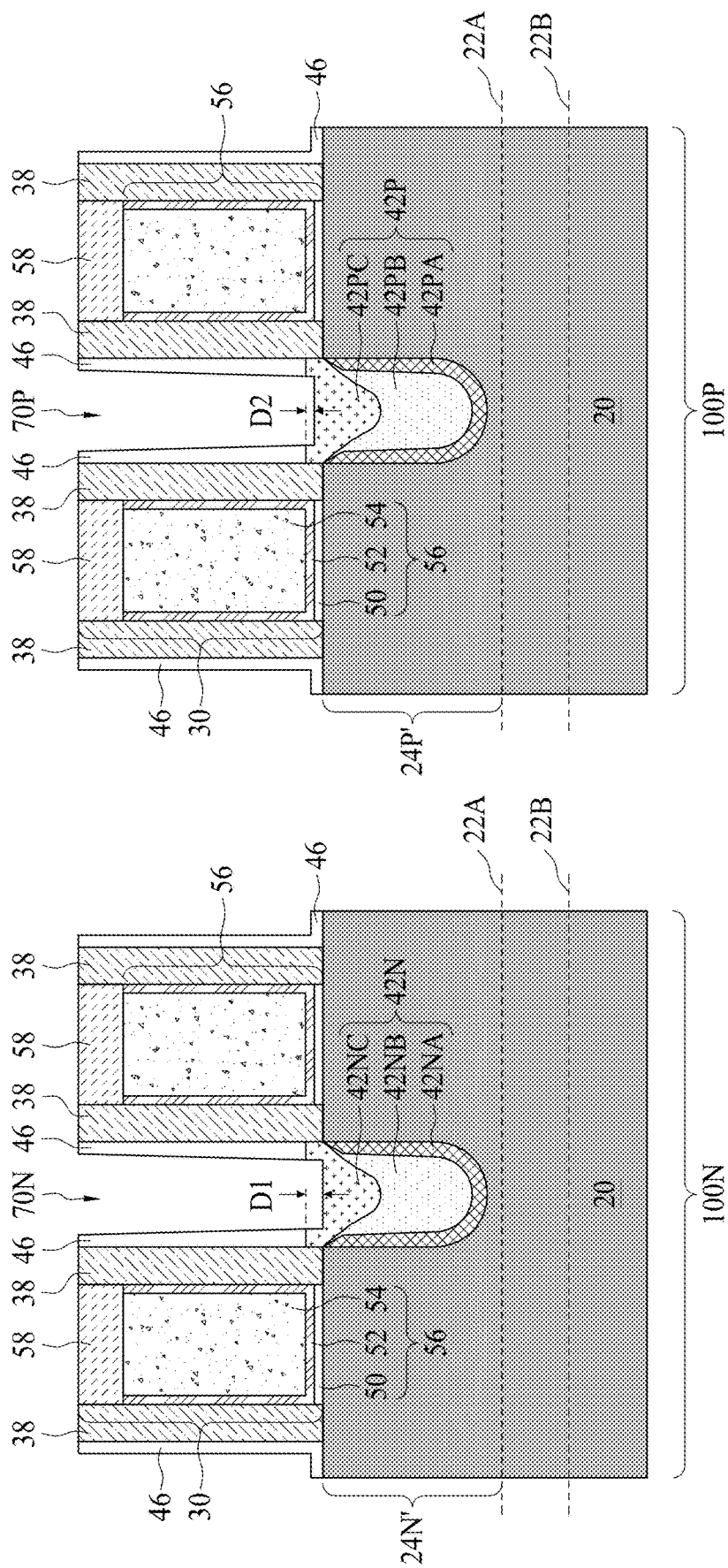
FIGS. 14A, 14B, 15A and 15B illustrate the perspective views and cross-sectional views of intermediate stages in the formation of an n-type Fin Field-Effect Transistor (FinFET) and a p-type FinFET in accordance with some embodiments.
Figure 14B:
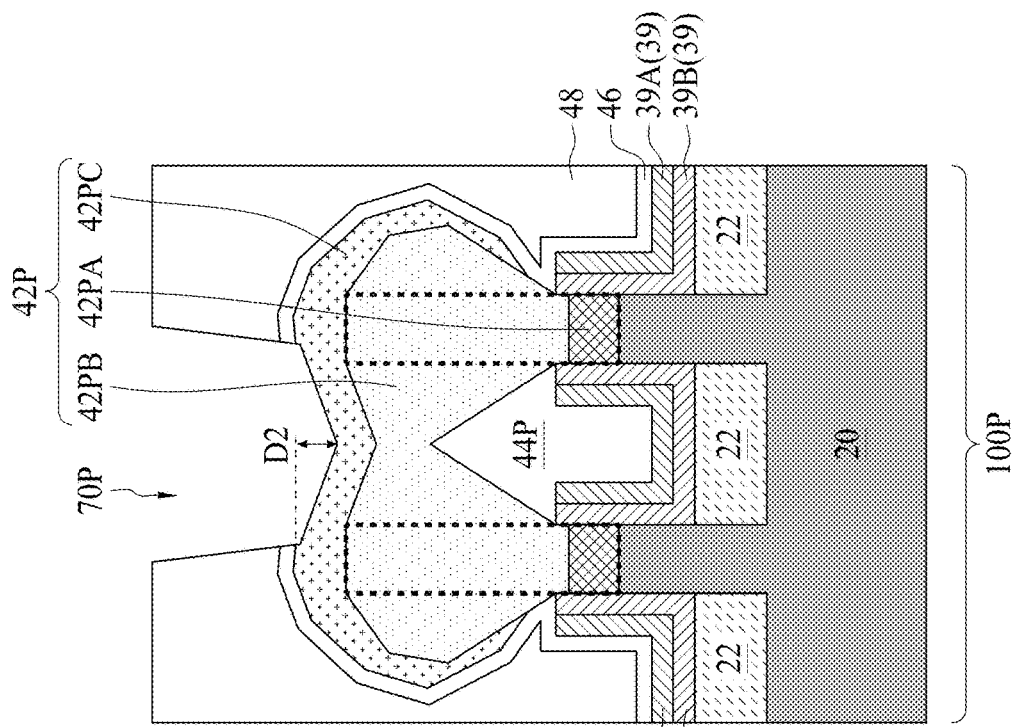
Figure 14B:
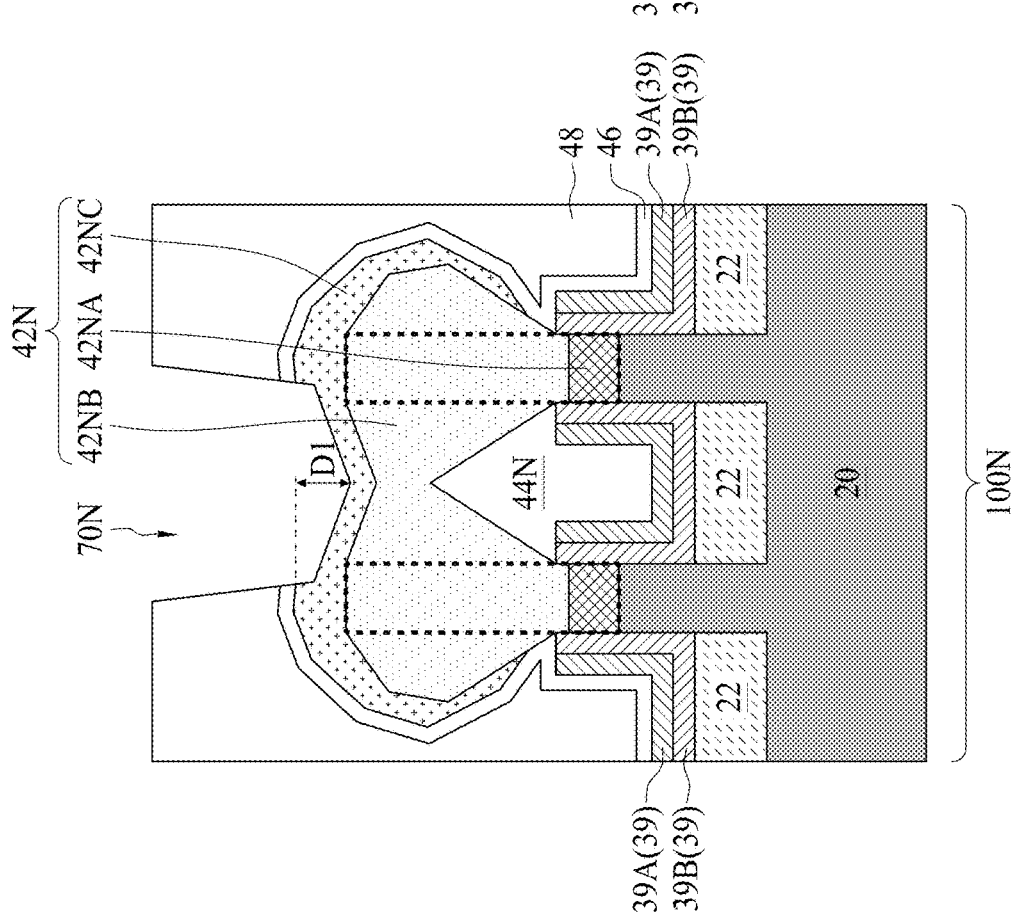

Referring to FIGS. 14A and 14B, the ILD layer 48 and the CESL 46 are etched to form recesses 70N and 70P in the absence of the protection layer 62 after the replacement gate stacks 56 are completed. The etching operation may be similar to that used in the etching operation with reference to FIGS. 10A, 10B, 12A and 12B. In some embodiments, the etching operation includes one or more etching steps, which may be isotropic or anisotropic. Referring, to FIGS. 14A and 14B, after the etching operation the recess 70N or 70P exposes the sidewalls of the ILD layer 48 or the CESL 46, instead of the sidewalls of the otherwise formed protection layer 62. The width of the recess 70N or 70P is thus greater than the recess 60N or 60P shown in FIGS. 12A and 12B.

Figure 15A:
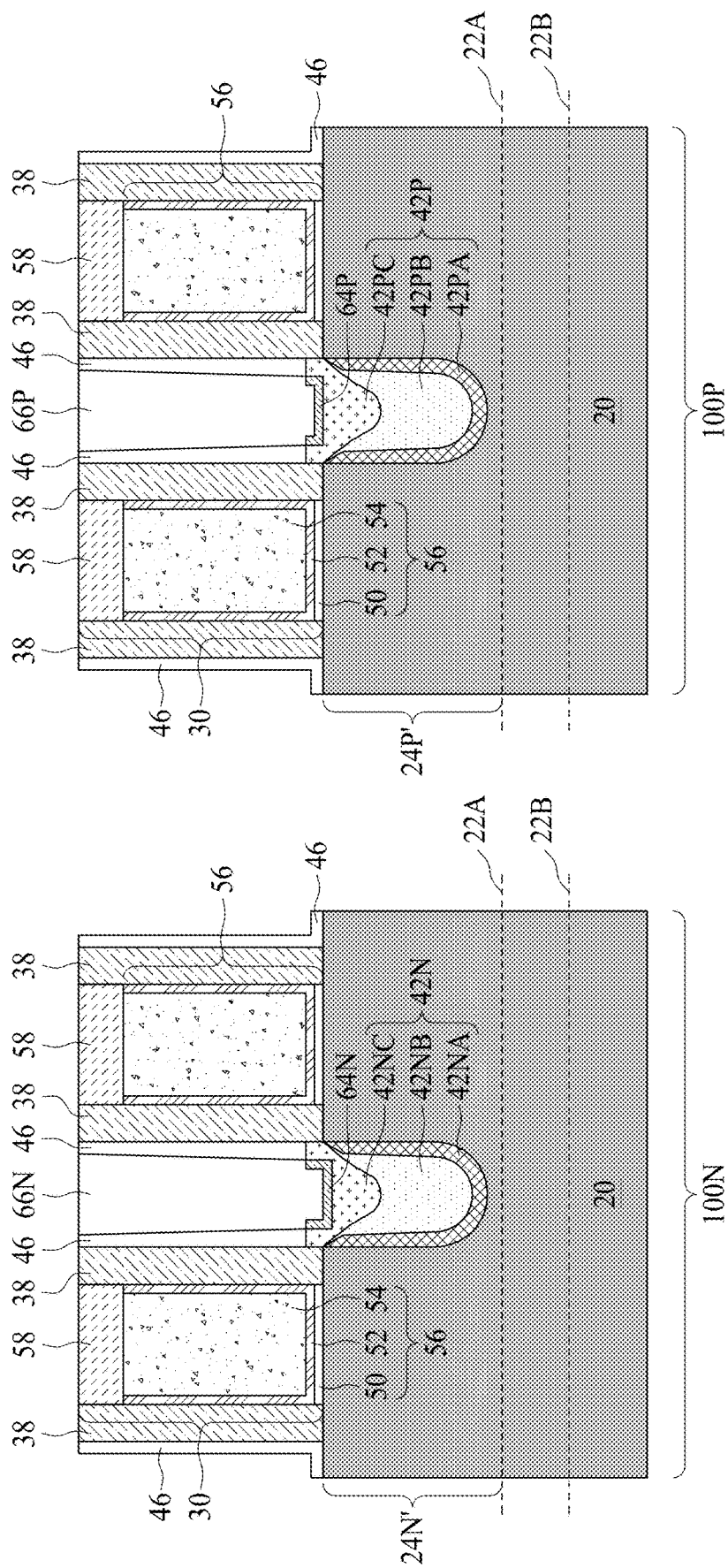
Figure 15B:
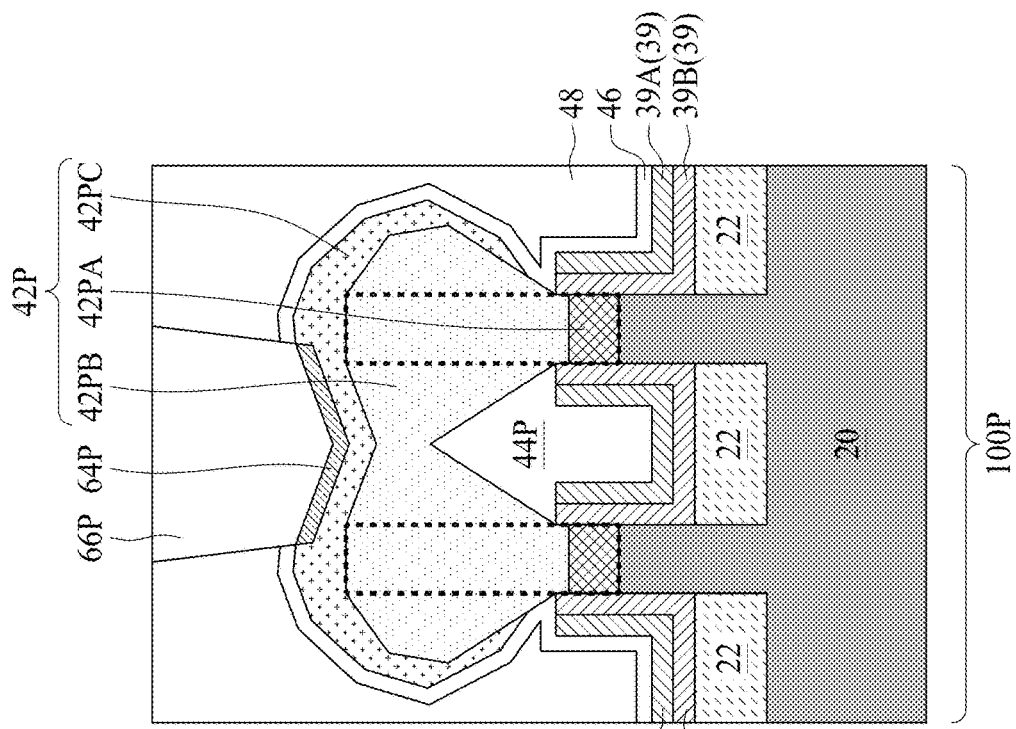
Figure 15B:
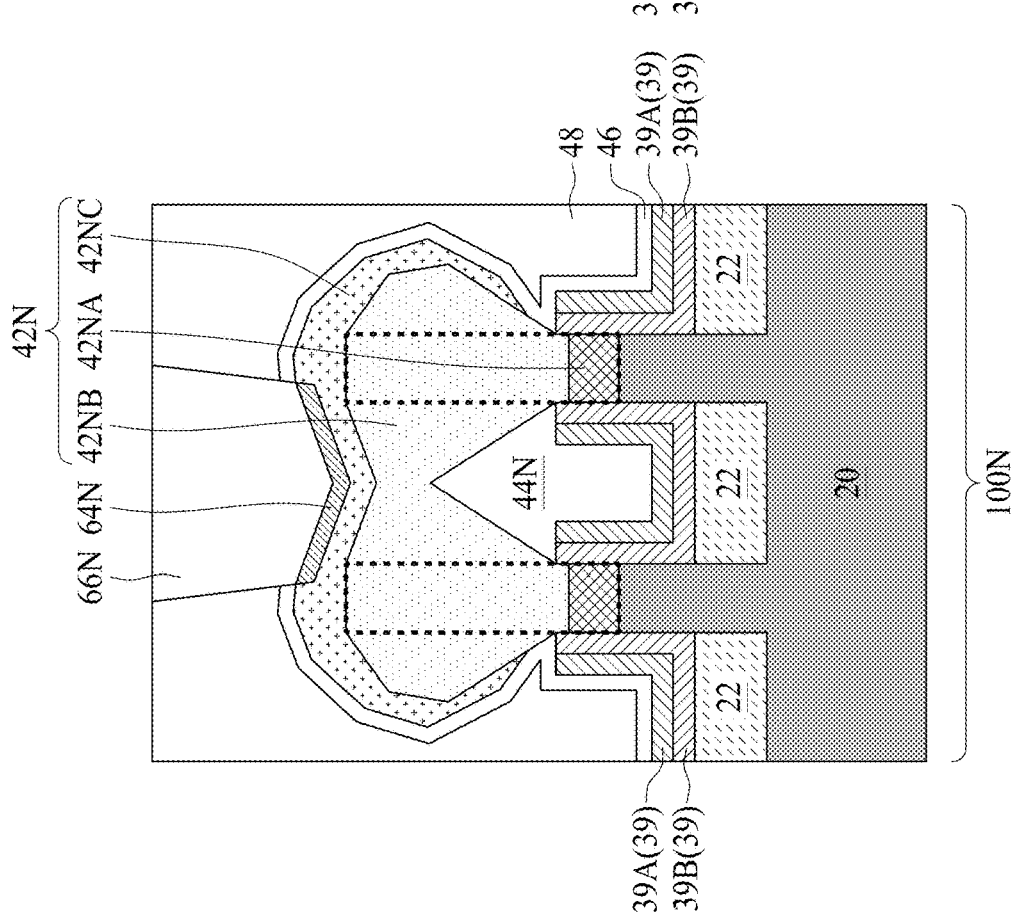

FIGS. 15A and 15B illustrate the formation of the silicide regions 64N, 64P and the conductive plugs 66N and 66P. The materials and methods of formation for the silicide regions 64N, 64P and the conductive plugs 66N and 66P shown in FIGS. 15A and 15B are similar to those shown in FIGS. 13A, 13B and 13C. The alternative embodiment illustrated in FIGS. 14A, 14B, 15A and 15B may save the processing time and cost of omitting the formation of the protection layer 62 and provide better conduction performance of the conductive plugs 66N and 66P.

FIGS. 16A, 16B, 17A and 17B illustrate the cross-sectional views of intermediate stages in the formation of an n-type Fin Field-Effect Transistor (FinFET) and a p-type FinFET in accordance with some embodiments. The formation process shown in FIGS. 16A, 16B, 17A and 17B follows the stage shown in FIG. 9, where the replacement gate stacks 56 are formed, and illustrate another alternative embodiment of etching the recesses 70N and 70P. The formation process is further followed by the step shown in FIGS. 15A and 15B.

Figure 16A:
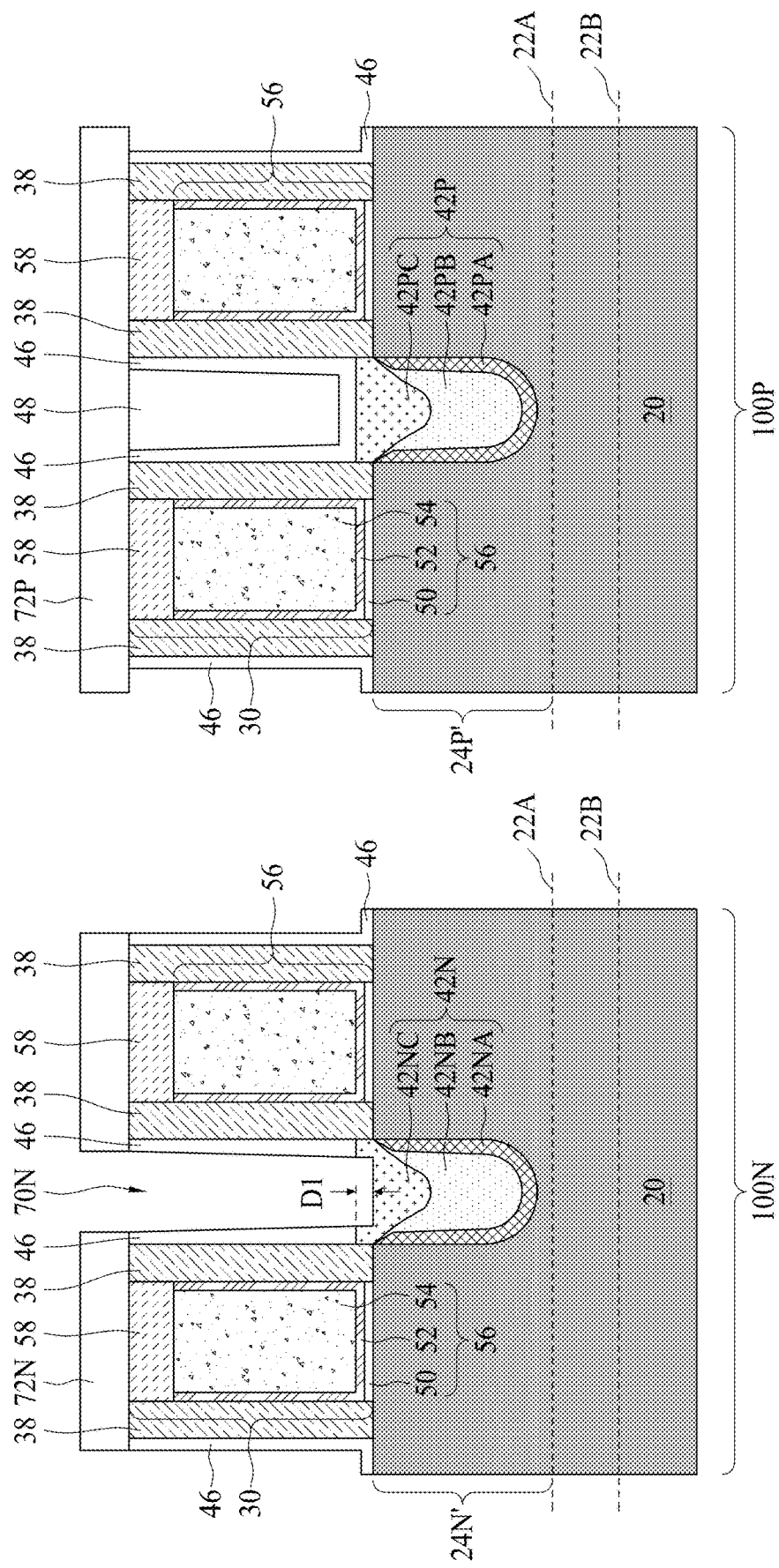
FIGS. 16A, 16B, 17A and 17B illustrate the perspective views and cross-sectional views of intermediate stages in the formation of an n-type Fin Field-Effect Transistor (FinFET) and a p-type FinFET in accordance with some embodiments.
Figure 16B:
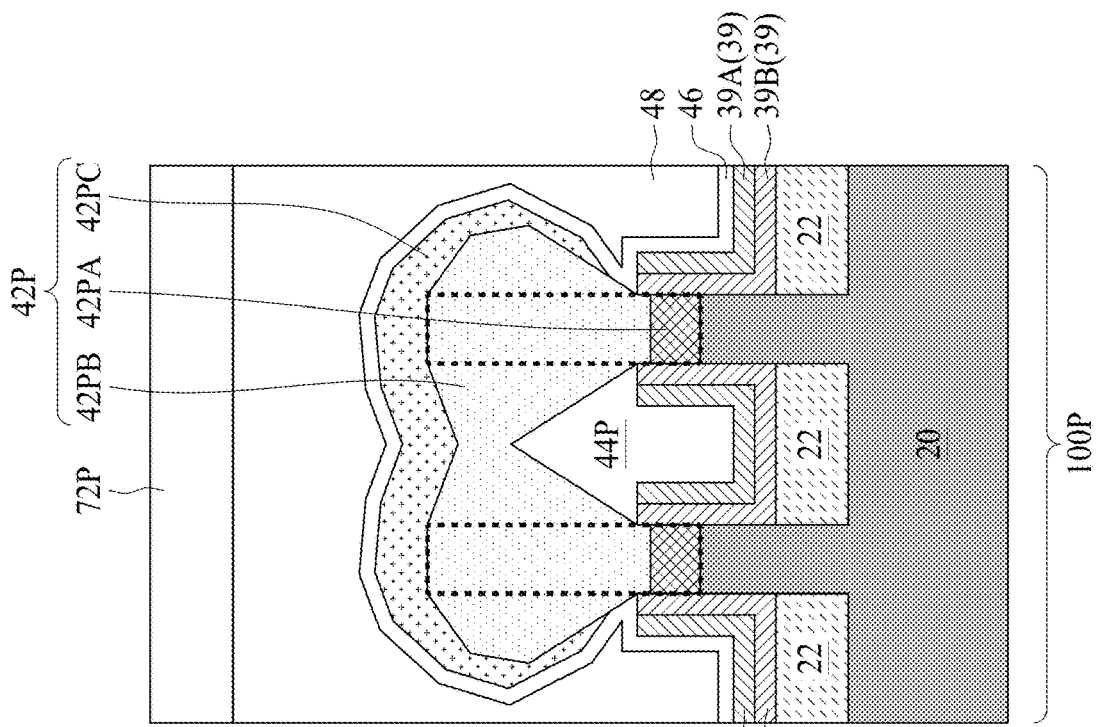
Figure 16B:
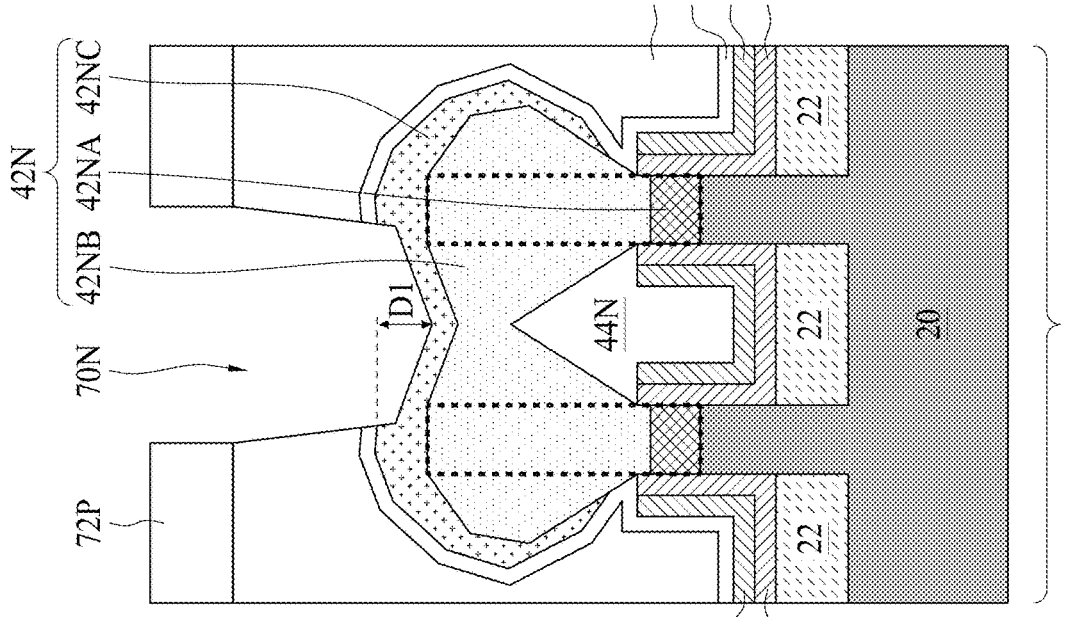

Referring to FIGS. 16A and 16B, recesses 70N are formed in the n-type device region 100N while no recesses 70P are not formed yet in the p-type device region 100P. In accordance with some embodiments, a patterned mask layer 72P is formed over the n-type device region 100N and the p-type device region 100P, where the patterned mask layer 72P includes a pattern exposing portions of the ILD layer 48 in the n-type device region 100N while covering the p-type device region 100P. In some embodiments, the ILD layer 48 and bottoms of the CESL 46 in the n-type device region 100N are etched to form the recess 70N in the absence of the protection layer 62 after the replacement gate stacks 56 are completed. The etching operation may be similar to that used in the etching operation with reference to FIGS. 10A, 10B, 12A and 12B. In some embodiments, the etching operation includes one or more etching steps, which may be isotropic or anisotropic. In some embodiments, the etchant used in FIGS. 16A and 16B is free of COS since a uniform etching performance without etching selectivity is sufficient. Referring to FIGS. 16A and 16B, after the etching operation the recess 70N exposes the sidewalls of the ILD layer 48 or the CESL 46 in a manner similar to that shown in FIGS. 14A and 14B. The width of the recess 70N is thus greater than the recess 60N shown in FIGS. 12A and 12B.

Figure 17A:
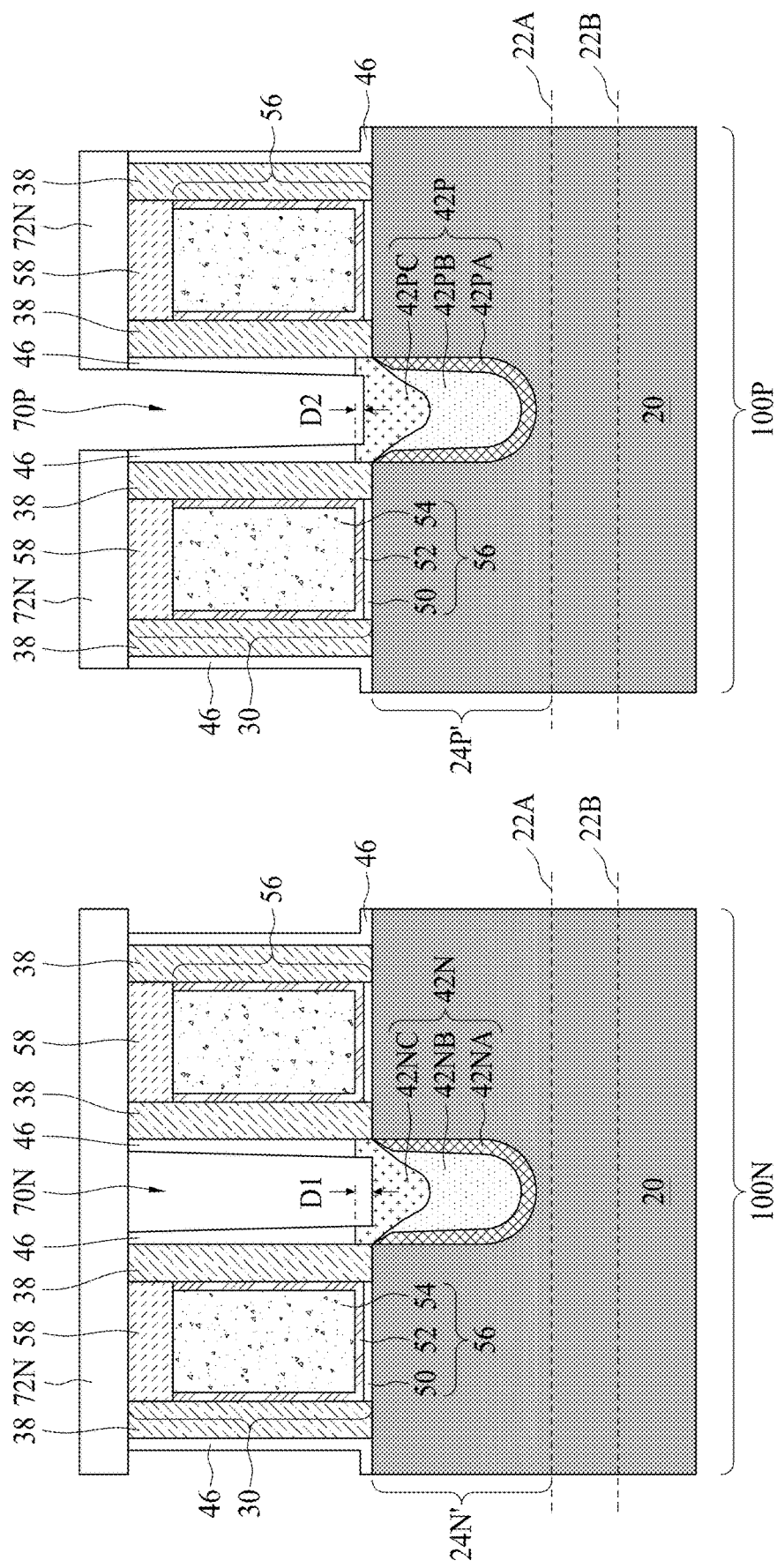
Figure 17B:
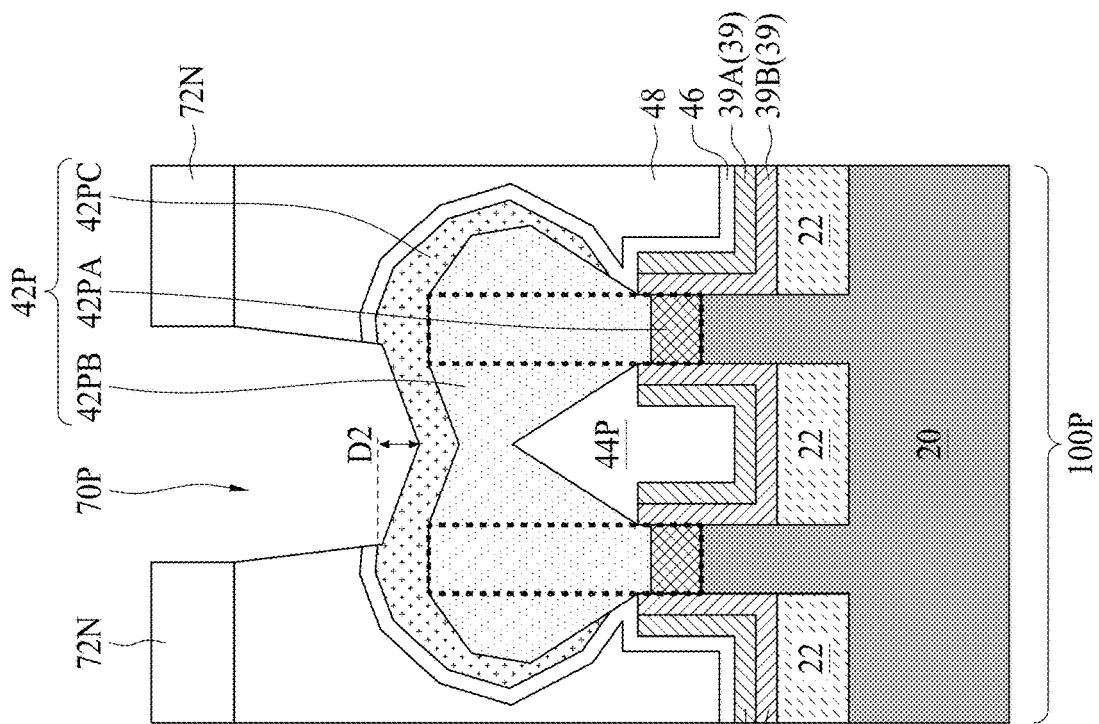
Figure 17B:
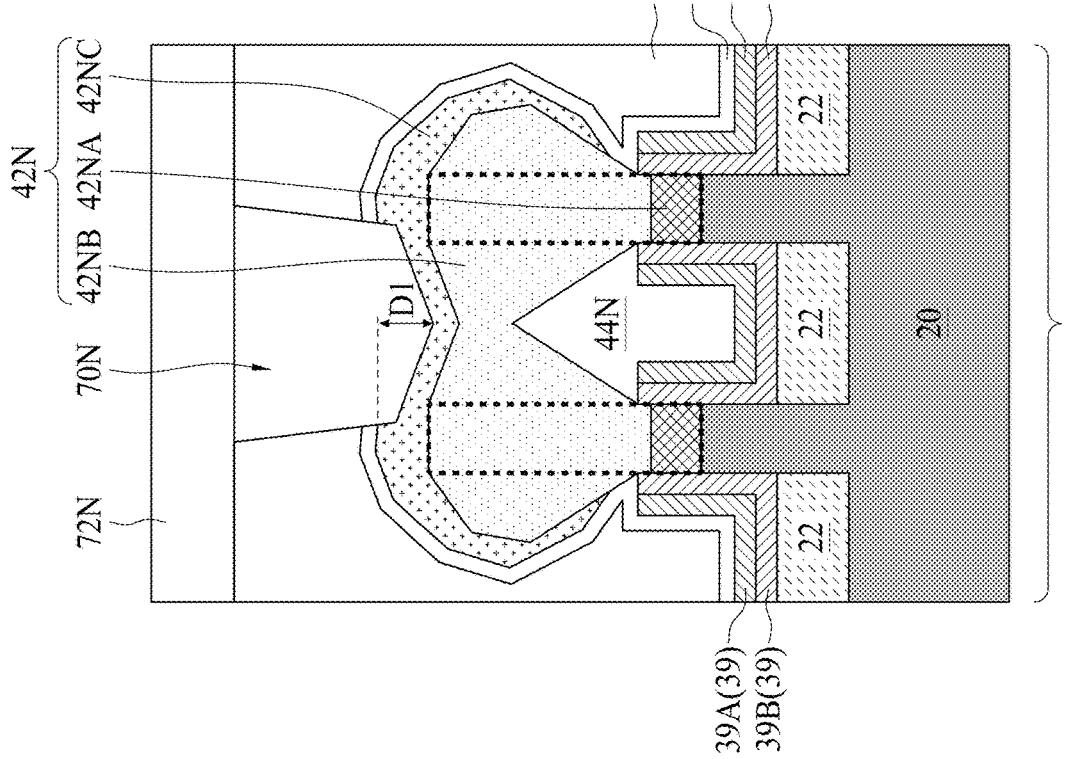

Referring to FIGS. 17A and 17B, recesses 70P are formed in the p-type device region 100P. In accordance with some embodiments, a patterned mask layer 72N is formed over the n-type device region 100N and the p-type device region 100P, where the patterned mask layer 72N includes a pattern exposing portions of the ILD layer 48 in the p-type device region 100P while covering the n-type device region 100N. In some embodiments, the ILD layer 48 and bottoms the CESL 46 in the p-type device region 100N are etched to form the recess 70P in the absence of the protection layer 62 after the replacement gate stacks 56 are completed. The etching operation may be similar to that used in the etching operation with reference to FIGS. 10A, 10B, 12A and 12B. In some embodiments, the etching operation includes one or more etching steps, which may be isotropic or anisotropic. In some embodiments, the etchant used in FIGS. 17A and 17B does not include COS and may be similar to that used in FIGS. 16A and 16B since a uniform etching performance without etching selectivity is sufficient. Referring to FIGS. 17A and 17B, after the etching operation the recess 70P exposes the sidewalls of the ILD layer 48 or the CESL 46 in a manner similar to that shown in FIGS. 14A and 14B. The width of the recess 70P is thus greater than the recess 60P shown in FIGS. 12A and 12B.

Figure 18:
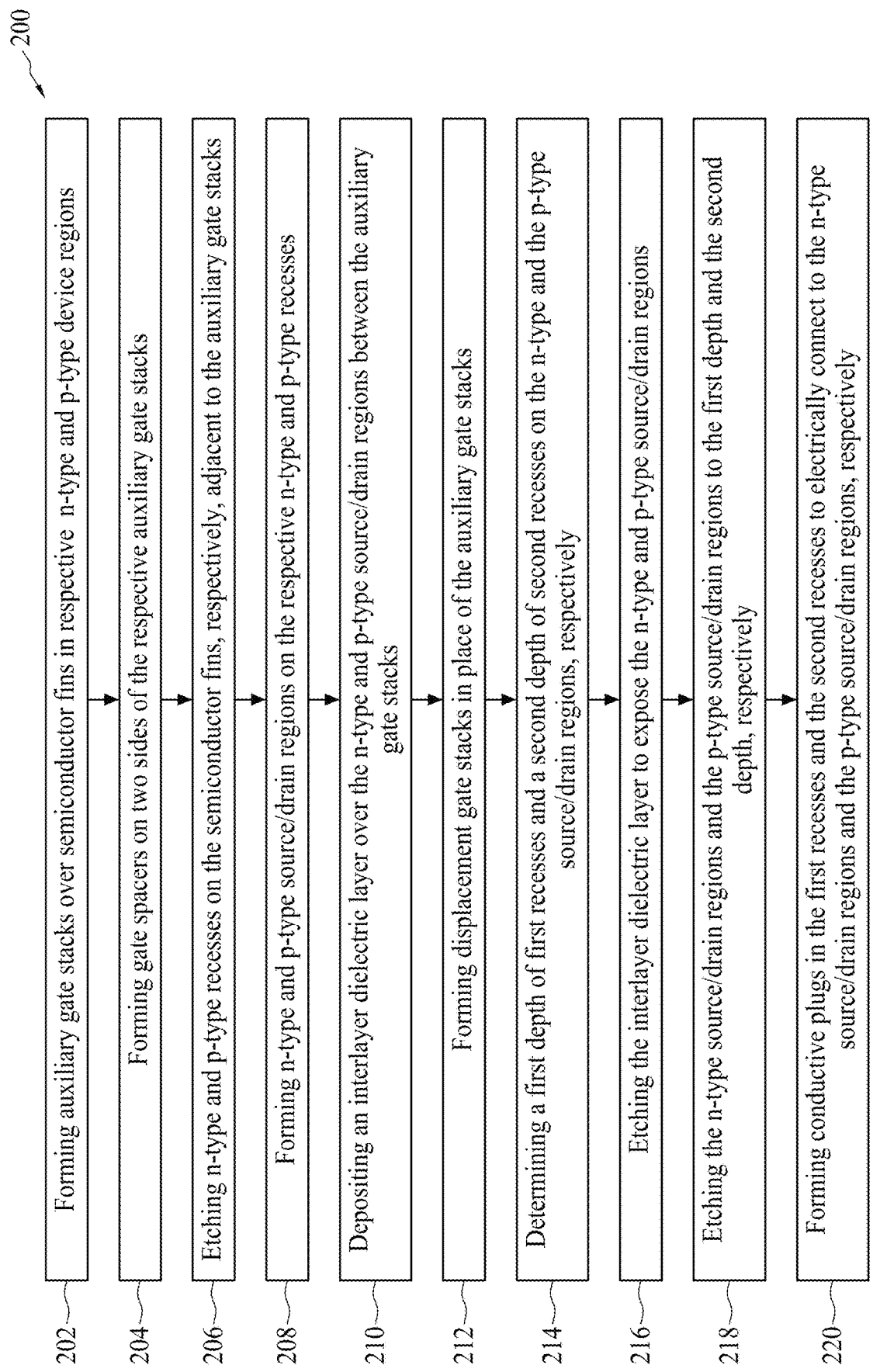
FIG. 18 shows a flowchart of a method of manufacturing a semiconductor structure, in accordance with some embodiments.

FIG. 18 shows a flowchart of a method 200 of manufacturing the semiconductor structure 10, in accordance with some embodiments. It shall be understood that additional steps can be provided before, during, and after the steps shown in FIG. 18, and some of the steps described below can be replaced or eliminated, for additional embodiments of the method 200. The order of the steps may be interchangeable. Some of the steps may be performed concurrently or independently.

At step 202, auxiliary gate 30 stacks are formed over semiconductor fins 24N and 24P in respective n-type device region 100N and the p-type device region 100P. At step 204, gate spacers 38 are formed on two sides of the respective auxiliary gate stacks 30.

At step 206, n-type recesses 40N and p-type recesses 40P are etched on the n-type semiconductor fins 24N and p-type semiconductor fins 24P, respectively, adjacent to the auxiliary gate stacks 30. At step 208, n-type source/drain regions 42N and p-type source/drain regions 42P are formed on the respective n-type recesses 40N and p-type recesses 40P.

At step 210, an interlayer dielectric (IDL) layer 48 is deposited over the n-type and p-type source/drain regions 42N, 42P between the auxiliary gate stacks 30. At step 212, displacement gate stacks 56 are formed in place of the auxiliary gate stacks 30.

At step 214, a first depth of first recesses and a second depth of second recesses on the respective n-type source/drain regions and p-type source/drain regions are determined. In some embodiments, the determination factor of the first depth and the second depth includes at least one of the following: the doping concentrations of the n-type source/drain regions 42N and p-type source/drain regions 42P, the germanium atomic percentage in the p-type source/drain regions 42P, the etching selectivity of the etchant gas used to etch the first depth D1 and the second depth D2, the widths of the recesses 60N and 60P, the channel resistance of the p-type FinFFT, and the stress level exerted on the channel region of the p-type FinFFT.

At step 216, the interlayer dielectric layer 48 is etched to expose the n-type and p-type source/drain regions 42N, 42P.

At step 218, the n-type source/drain regions and the p-type source/drain regions are etched to the first depth and the second depth, respectively, from top surfaces of the n-type and p-type source/drain regions, based on the determination result in step 216.

At step 220, conductive plugs are formed in the first recesses and second recesses to electrically connect to the n-type source/drain regions and the p-type source/drain regions, respectively.

Some embodiments of the present disclosure provide a method. The method includes forming an n-type Fin-Field Effect Transistor (FinFET) and a p-type FinFET. The forming of the n-type FinFFT includes: forming a first auxiliary gate stack over a first semiconductor fin; forming an n-type source/drain region on the first semiconductor fin adjacent to the first auxiliary gate stack; and performing a first etch to form a first recess with a first depth on a first top surface of the n-type source/drain region. The forming of the p-type FinFFT includes: forming a second auxiliary gate stack over a second semiconductor fin; forming a p-type source/drain region on the second semiconductor fin adjacent to the second auxiliary gate stack; and performing a second etch to form a second recess with a second depth on a second top surface of the p-type source/drain region. The first depth is greater than the second depth.

Some embodiments of the present disclosure provide a method. The method includes: forming a first auxiliary gate stack over an n-type semiconductor fin in an n-type device region; forming a second auxiliary gate stack over a p-type semiconductor fin in a p-type device region; forming an n-type source/drain region on the n-type semiconductor fin adjacent to the first auxiliary gate stack; forming a p-type source/drain region on the p-type semiconductor fin adjacent to the second auxiliary gate stack; depositing an interlayer dielectric (ILD) layer over the n-type source/drain region and the p-type source/drain region; forming a first replacement gate stack and a second replacement gate stack in place of the first auxiliary gate stack and the second auxiliary gate stack, respectively; etching the ILD layer to expose the n-type source/drain region and the p-type source/drain region; and forming a first recess from a top surface of the n-type source/drain region and a second recess from a top surface of the p-type source/drain region. The first recess has a first depth, and the second recess has a second depth less than the first depth.

Some embodiments of the present disclosure provide a semiconductor structure, including an n-type Fin-Field Effect Transistor (FinFET) and a p-type FinFFT. The n-type FinFFT includes a first gate stack over a first semiconductor fin, a first gate spacer on two sides of the first gate stack, n-type source/drain regions on two sides of the first gate spacer; and a first conductive plug on each of the n-type source/drain regions. The p-type FinFFT includes a second gate stack over a second semiconductor fin, a second gate spacer on two sides of the second gate stack, p-type source/drain regions on two sides of the second gate spacer, and a second conductive plug on each of the p-type source/drain region. The first conductive plug extends into one of the n-type source/drain regions by a first height, and the second conductive plug extends into one of the p-type source/drain regions by a second height less than the first height by a height difference greater than about 2 nm.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an n-type Fin-Field Effect Transistor (FinFET) comprising:
 forming a first auxiliary gate stack over a first semiconductor fin;
 forming an n-type source/drain region on the first semiconductor fin adjacent to the first auxiliary gate stack;
 depositing an interlayer dielectric (ILD) layer to cover to laterally surround the n-type source drain;
 removing the ILD layer to expose a first portion of the n-type source/drain region;
 depositing a first protection layer over the first exposed portion of the n-type source/drain region; and
 performing a first etch to form a first recess with a first depth on a first top surface of the n-type source/drain region; and
forming a p-type FinFET comprising:
 forming a second auxiliary gate stack over a second semiconductor fin;
 forming a p-type source/drain region on the second semiconductor fin adjacent to the second auxiliary gate stack;
 depositing the interlayer dielectric (ILD) layer to cover to laterally surround the p-type source drain;
 removing the ILD layer to expose a second portion of the p-type source/drain region;
 forming a second protection layer over the second exposed portion of the p-type source/drain region; and
 performing a second etch to form a second recess with a second depth on a second top surface of the p-type source/drain region,
wherein the first depth is greater than the second depth,
wherein the performing of the first etch and the second etch comprising etching through the first protection layer and the second protection layer to re-expose the first exposed portion and the second exposed portion.

2. The method of claim 1, wherein the first depth is greater than the second depth by a depth difference, wherein a ratio between the depth difference and the first depth is between about 10% and about 40%.

3. The method of claim 2, wherein the depth difference is between about 2 nm and about 6 nm.

4. The method of claim 1, wherein the first etch and the second etch are performed using a single etching operation.

5. The method of claim 4, wherein the performing of the first etch and the second etch comprises using an etchant gas comprising carbonyl sulfide.

6. The method of claim 5, wherein the etchant gas etches the n-type source/drain region with a first etching rate greater than a second etching rate for etching the p-type source/drain region.

7. The method of claim 5, wherein the etchant gas further comprises fluorine-based gas, wherein a flow rate ratio between the carbonyl sulfide and the fluorine-based gas is between about 5% and about 70%.

8. The method of claim 1, wherein the depositing of the first protection layer comprising depositing the first protection layer over the ILD layer.

9. The method of claim 1, wherein the first etch and the second etch comprise anisotropic etching to provide an etching rate on a bottom portion of the first or second protection layer greater than an etching rate on vertical portions of the first or second protection layer.

10. The method of claim 1, wherein the forming of the n-type FinFET further comprises forming a first gate spacer on two sides of the first auxiliary gate stack, wherein the forming of the p-type FinFET further comprises forming a second gate spacer on two sides of the second auxiliary gate stack, further comprising:
forming a first replacement gate stack in place of the first auxiliary gate stack subsequent to the depositing of the ILD layer; and
removing the ILD layer to expose the first gate spacer and the second gate spacer prior to the depositing of the first protection layer and the second protection layer.

11. The method of claim 10, wherein the removing of the ILD layer is performed during the first etch and the second etch.

12. The method of claim 1, further comprising forming a first conductive plug and a second conductive plug in the first recess and the second recess to be electrically connected to the n-type source/drain region and the p-type source/drain region, respectively.

13. A method comprising:
forming a first auxiliary gate stack over an n-type semiconductor fin in an n-type device region;
forming a second auxiliary gate stack over a p-type semiconductor fin in a p-type device region;
forming an n-type source/drain region on the n-type semiconductor fin adjacent to the first auxiliary gate stack;
forming a p-type source/drain region on the p-type semiconductor fin adjacent to the second auxiliary gate stack;
depositing an interlayer dielectric (ILD) layer over the n-type source/drain region and the p-type source/drain region;
forming a first replacement gate stack and a second replacement gate stack in place of the first auxiliary gate stack and the second auxiliary gate stack, respectively;
etching the ILD layer to expose the n-type source/drain region and the p-type source/drain region;
depositing a protection layer over the n-type source/drain region and the p-type source/drain region; and
forming a first recess from a top surface of the n-type source/drain region and a second recess from a top surface of the protection layer, wherein the first recess has a first depth, and the second recess has a second depth less than the first depth.

14. The method of claim 13, further comprising depositing an etch stop layer over the first auxiliary gate stack and the second auxiliary gate stack prior to the depositing of the ILD layer.

15. The method of claim 14, wherein the forming of the first recess and the second recess comprising removing bottom portions of the protection layer in the first recess and the second recess while keeping sidewall portions of the protection layer on sidewalls of the first recess and the second recess.

16. The method of claim 13, further comprising determining the first depth and the second depth based on factors including at least one of the following: a germanium atomic percentage in the p-type source/drain region, an etching selectivity of an etchant gas used to etch the first depth and the second depth, a first width of the first recess, a second width of the second recess, and a channel resistance of a p-type FinFFT including the p-type source/drain region.

17. The method of claim 13, wherein the forming of the n-type source/drain region comprises:
forming a first epitaxy layer on the n-type semiconductor fin, wherein the first epitaxy layer having a first doping concentration;
forming a second epitaxy layer over the first epitaxy layer, wherein the second epitaxy layer has a second doping concentration greater than the first doping concentration; and
forming a third epitaxy layer over the second epitaxy layer, wherein the third epitaxy layer has a third doping concentration greater than the second doping concentration, wherein the first recess has a bottom surrounded by the third epitaxy layer.

18. A semiconductor structure, comprising:
an n-type Fin-Field Effect Transistor (FinFET) comprising:
a first gate stack over a first semiconductor fin;
a first gate spacer on two sides of the first gate stack;
n-type source/drain regions on two sides of the first gate spacer;
a first conductive plug on each of the n-type source/drain regions;
a first dielectric layer laterally surrounding the first conductive plug; and
an interlayer dielectric (ILD) layer laterally surrounding the first dielectric layer; and
a p-type FinFET comprising:
a second gate stack over a second semiconductor fin;
a second gate spacer on two sides of the second gate stack;
p-type source/drain regions on two sides of the second gate spacer;
a second conductive plug on each of the p-type source/drain region; and
a second dielectric layer laterally surrounding the second conductive plug,
wherein the ILD layer laterally surrounding the second dielectric layer,
wherein the first conductive plug extends into one of the n-type source/drain regions by a first height, and the second conductive plug extends into one of the p-type source/drain regions by a second height less than the first height by a height difference greater than about 2 nm.

19. The semiconductor structure of claim 18, wherein each of the n-type source/drain regions comprises:
a first epitaxy layer over a semiconductor fin and having a first doping concentration;
a second epitaxy layer over the first epitaxy layer, wherein the second epitaxy layer has a second doping concentration greater than the first doping concentration; and
a third epitaxy layer over the second epitaxy layer, wherein the third epitaxy layer has a third doping concentration greater than the second doping concentration, wherein the first conductive plug has a bottom surrounded by the third epitaxy layer.

20. The semiconductor structure of claim 19, wherein the third epitaxy layer has a third height measured from a top surface of the third epitaxy layer to a bottom surface of the third epitaxy layer in a central portion surrounded by the second epitaxy layer, and a ratio between the height difference and the third height is between about 10% and about 40%.

* * * * *